United States Patent
Han et al.

(10) Patent No.: US 10,784,244 B2
(45) Date of Patent: Sep. 22, 2020

(54) SEMICONDUCTOR PACKAGE INCLUDING MULTIPLE SEMICONDUCTOR CHIPS AND METHOD OF MANUFACTURING THE SEMICONDUCTOR PACKAGE

(71) Applicant: Samsung Electronics Co., Ltd., Suwon-si, Gyeonggi-do (KR)

(72) Inventors: Won-Gil Han, Cheongju-si (KR); Seung-Lo Lee, Asan-si (KR); Yong-Je Lee, Cheonan-si (KR); Sung-Il Cho, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/177,968

(22) Filed: Nov. 1, 2018

(65) Prior Publication Data

US 2019/0259742 A1 Aug. 22, 2019

(30) Foreign Application Priority Data

Feb. 20, 2018 (KR) .................. 10-2018-0019747

(51) Int. Cl.
*H01L 25/18* (2006.01)
*H01L 23/00* (2006.01)
*H01L 25/00* (2006.01)

(52) U.S. Cl.
CPC .............. *H01L 25/18* (2013.01); *H01L 24/09* (2013.01); *H01L 24/13* (2013.01); *H01L 24/16* (2013.01);

(Continued)

(58) Field of Classification Search
CPC ......... H01L 25/18; H01L 24/49; H01L 24/73; H01L 24/13; H01L 24/16; H01L 24/17; H01L 24/48; H01L 245/50; H01L 24/09; H01L 24/73253; H01L 2224/09517; H01L 2224/49275; H01L 2224/48106; H01L 2224/48101; H01L 2224/4813; H01L 2224/48145; H01L 2224/48227;

(Continued)

(56) References Cited

U.S. PATENT DOCUMENTS 7,368,811 B2 5/2008 Kang
7,928,551 B2 4/2011 Fujiwara (Continued)

FOREIGN PATENT DOCUMENTS

JP 5184132 4/2013
JP 2013171913 9/2013

(Continued)

*Primary Examiner* — Alexander O Williams
(74) *Attorney, Agent, or Firm* — Myers Bigel, P.A.

(57) ABSTRACT

A semiconductor package includes a package substrate, at least one first semiconductor chip on the package substrate and having a first height as measured from the package substrate, at least one second semiconductor chip on the package substrate spaced apart from the first semiconductor chip and having a second height less than the first height as measured from the package substrate, at least one third semiconductor chip stacked on the first and second semiconductor chips, and at least one support structure between the at least one second semiconductor chip and the at least one third semiconductor chip configured to support the at least one third semiconductor chip.

13 Claims, 23 Drawing Sheets

(52) U.S. Cl.
CPC .............. *H01L 24/17* (2013.01); *H01L 24/32* (2013.01); *H01L 24/48* (2013.01); *H01L 24/49* (2013.01); *H01L 24/73* (2013.01); *H01L 24/83* (2013.01); *H01L 25/50* (2013.01); *H01L 24/06* (2013.01); *H01L 2224/05553* (2013.01); *H01L 2224/05554* (2013.01); *H01L 2224/0612* (2013.01); *H01L 2224/09517* (2013.01); *H01L 2224/1308* (2013.01); *H01L 2224/13025* (2013.01); *H01L 2224/16145* (2013.01); *H01L 2224/16146* (2013.01); *H01L 2224/171* (2013.01); *H01L 2224/1703* (2013.01); *H01L 2224/17517* (2013.01); *H01L 2224/32145* (2013.01); *H01L 2224/4813* (2013.01); *H01L 2224/48101* (2013.01); *H01L 2224/48106* (2013.01); *H01L 2224/48145* (2013.01); *H01L 2224/48227* (2013.01); *H01L 2224/4903* (2013.01); *H01L 2224/4917* (2013.01); *H01L 2224/49175* (2013.01); *H01L 2224/73203* (2013.01); *H01L 2224/73207* (2013.01); *H01L 2224/73215* (2013.01); *H01L 2224/73253* (2013.01); *H01L 2224/73265* (2013.01); *H01L 2224/83138* (2013.01); *H01L 2224/83191* (2013.01); *H01L 2224/83385* (2013.01); *H01L 2924/00014* (2013.01); *H01L 2924/15311* (2013.01); *H01L 2924/181* (2013.01)

(58) Field of Classification Search
CPC ..... H01L 2224/4917; H01L 2224/1308; H01L 2224/171; H01L 2224/1703; H01L 2224/16146; H01L 2224/73265; H01L 2224/73215; H01L 2224/73207; H01L 2224/16145; H01L 2224/83191; H01L 24/50
USPC .......................................................... 257/777
See application file for complete search history.

(56) References Cited

U.S. PATENT DOCUMENTS

| | | | | |
|---|---|---|---|---|
| 8,557,635 | B2* | 10/2013 | Omizo | H01L 21/6835 438/107 |
| 9,257,309 | B2 | 2/2016 | Lee | |
| 10,418,298 | B2* | 9/2019 | Lin | H01L 23/5389 |
| 2004/0262774 | A1 | 12/2004 | Kang | |
| 2010/0044861 | A1 | 2/2010 | Chiu | |
| 2010/0314740 | A1* | 12/2010 | Choi | H01L 23/3121 257/686 |
| 2011/0089575 | A1 | 4/2011 | Lee | |
| 2013/0056882 | A1* | 3/2013 | Kim | H01L 23/16 257/777 |
| 2013/0277831 | A1 | 10/2013 | Yoon | |
| 2018/0122789 | A1* | 5/2018 | Kang | H01L 24/20 |
| 2018/0331087 | A1* | 11/2018 | Lee | H01L 24/95 |
| 2019/0051634 | A1* | 2/2019 | Park | H01L 25/074 |
| 2019/0244944 | A1* | 8/2019 | Lee | H01L 25/0652 |

FOREIGN PATENT DOCUMENTS

| | | |
|---|---|---|
| KR | 1020090043945 | 5/2009 |
| KR | 1020110020547 | 3/2011 |
| KR | 1020110041301 | 4/2011 |

* cited by examiner

SEMICONDUCTOR PACKAGE INCLUDING MULTIPLE SEMICONDUCTOR CHIPS AND METHOD OF MANUFACTURING THE SEMICONDUCTOR PACKAGE

CROSS REFERENCE TO RELATED APPLICATION

This application claims priority under 35 U.S.C. § 119 to Korean Patent Application No. 10-2018-0019747, filed on Feb. 20, 2018 in the Korean Intellectual Property Office (KIPO), the contents of which are herein incorporated by reference in their entirety.

BACKGROUND

1. Field

Example embodiments of the inventive concept relate to a semiconductor package and a method of manufacturing the semiconductor package. More particularly, example embodiments of the inventive concept relate to a multi-chip package including semiconductor chips having different heights on a package substrate and a method of manufacturing the semiconductor package.

2. Description of the Related Art

In a multi-chip package (MCP), a spacer chip may be used to support an overhanging portion of the uppermost semiconductor chip. However, various manufacturing processes, such as a back lap process, a sawing process, a die attach process, etc. may be performed to form the spacer chip, thereby causing a rise in costs and a decrease in productivity.

SUMMARY

Example embodiments provide a semiconductor package capable of reducing costs and improving productivity.

Example embodiments provide a method of manufacturing the semiconductor package.

According to example embodiments, a semiconductor package includes a package substrate, at least one first semiconductor chip on the package substrate and having a first height as measured from the package substrate, at least one second semiconductor chip on the package substrate spaced apart from the first semiconductor chip and having a second height less than the first height as measured from the package substrate, at least one third semiconductor chip stacked on the first and second semiconductor chips, and at least one support structure between the at least one second semiconductor chip and the at least one third semiconductor chip configured to support the at least one third semiconductor chip.

According to example embodiments, a semiconductor package includes a package substrate, a plurality of first semiconductor chips stacked sequentially on the package substrate and having a first height as measured from the package substrate, a second semiconductor chip on the package substrate and having a second height less than the first height as measured from the package substrate, a plurality of third semiconductor chips stacked on the package substrate so as to at least partially cover the first and second semiconductor chips in a plan view of the semiconductor package, and at least one support structure between the second semiconductor chip and a lowermost third semiconductor chip of the plurality of third semiconductor chips configured to support the plurality of third semiconductor chips.

According to example embodiments, in a method of manufacturing a semiconductor package, a plurality of first semiconductor chips are sequentially stacked on the package substrate so as to have a first height as measured from the package substrate. A second semiconductor chip is formed on the package substrate so as to have a second height less than the first height as measured from the package substrate. A support structure is formed on the second semiconductor chip. A plurality of third semiconductor chips is stacked on the support structure so as to cover the plurality of first semiconductor chips and the second semiconductor chip in a plan view of the semiconductor package.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments of the inventive concept.

FIG. 2 is a plan view illustrating the semiconductor package in FIG. 1.

FIG. 3 is a perspective view illustrating a support structure of the semiconductor package in FIG. 1.

FIG. 4 is a cross-sectional view taken along the line A-A' in FIG. 3.

FIGS. 5 and 6 are perspective views illustrating various shapes of the support structure in FIG. 3 in accordance with different embodiments of the inventive concept.

FIGS. 7 to 11 are views illustrating a method of manufacturing a semiconductor package in accordance with example embodiments of the inventive concept.

FIG. 12 is a cross-sectional view illustrating a semiconductor package in accordance with example embodiments of the inventive concept.

FIG. 13 is a cross-sectional view illustrating a support structure of the semiconductor package in FIG. 12.

FIGS. 14 and 15 are cross-sectional views illustrating a method of manufacturing a semiconductor package in accordance with example embodiments of the inventive concept.

FIG. 16 is a cross-sectional view illustrating a semiconductor package in accordance with example embodiments of the inventive concept.

FIG. 17 is a cross-sectional view illustrating a support structure of the semiconductor package in FIG. 16.

FIGS. 18 and 19 are cross-sectional views illustrating a method of manufacturing a semiconductor package in accordance with example embodiments of the inventive concept.

FIG. 20 is a cross-sectional view illustrating a semiconductor package in accordance with example embodiments of the inventive concept.

FIG. 21 is a cross-sectional view illustrating a support structure of the semiconductor package in FIG. 20.

FIGS. 22 and 23 are cross-sectional views illustrating a method of manufacturing a semiconductor package in accordance with example embodiments of the inventive concept.

FIG. 24 is a cross-sectional view illustrating a semiconductor package in accordance with example embodiments of the inventive concept.

DETAILED DESCRIPTION

Hereinafter, example embodiments will be explained in detail with reference to the accompanying drawings. Like reference numbers signify like elements throughout the description of the figures. It is noted that aspects of the invention described with respect to one embodiment, may be incorporated in a different embodiment although not specifically described relative thereto. That is, all embodiments and/or features of any embodiment can be combined in any way and/or combination.

Some embodiments of the inventive concept stem from a realization that a spacer chip is typically used to support an overhanging or cantilevered portion of a semiconductor chip in a multi-chip package. The spacer chip is often formed using manufacturing processes, such as a die attach process, back lap process, and/or a sawing process, which my increase costs and decrease manufacturing productivity. According to example embodiments of the inventive concept, a semiconductor package may include first semiconductor chips having a first height, a second semiconductor chip having a second height less than the first height, a support structure on the second semiconductor chip, and third semiconductor chips supported by the support structure. The support structure may be on the second semiconductor chip, which has a relatively smaller height to compensate for the height difference between the adjacent first semiconductor chips, and to support the overlying third semiconductor chips. Accordingly, the support structure may be substituted for a conventional spacer chip for supporting the overlying chip and may be formed during a wiring boding process, to thereby reduce costs and improve manufacturing productivity.

Figure 1:
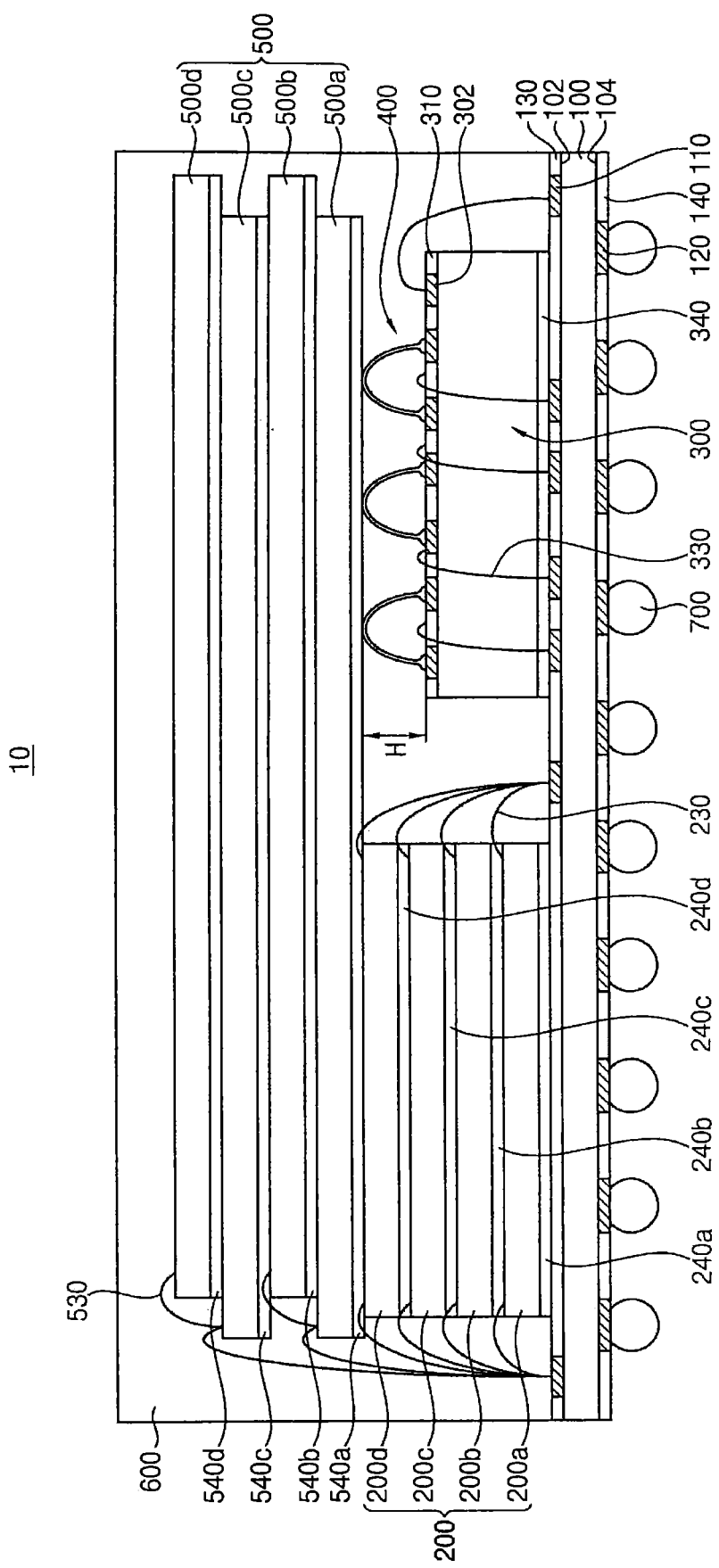
FIGS. 1 to 24 represent non-limiting, example embodiments as described herein.
Figure 2:
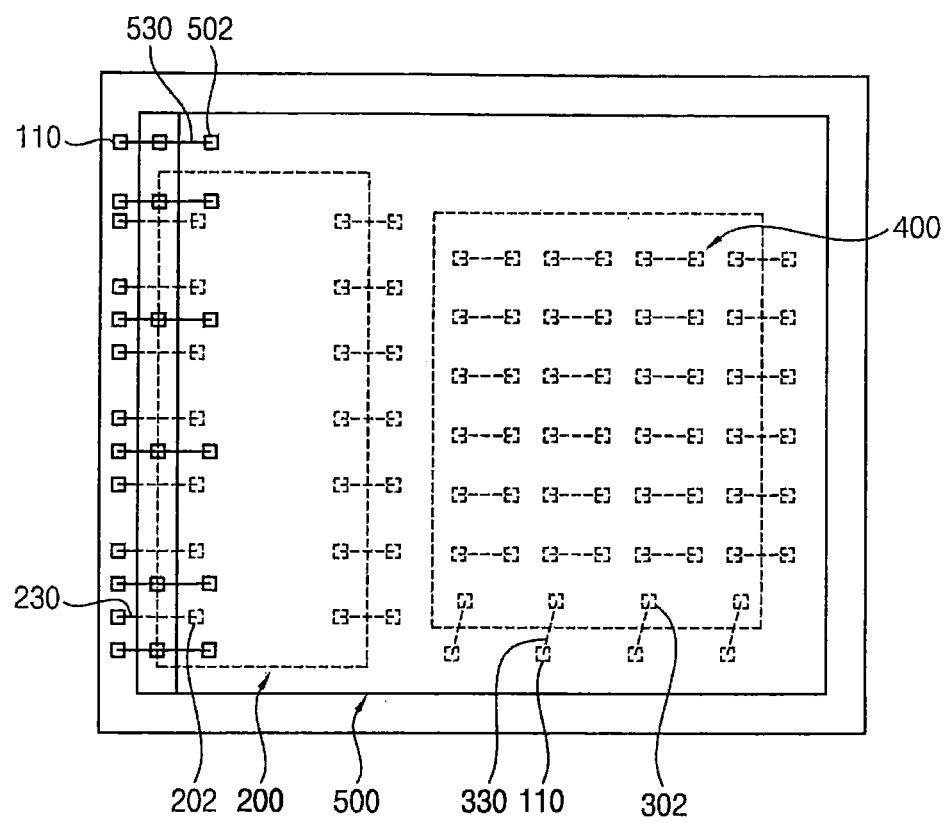
Figure 3:
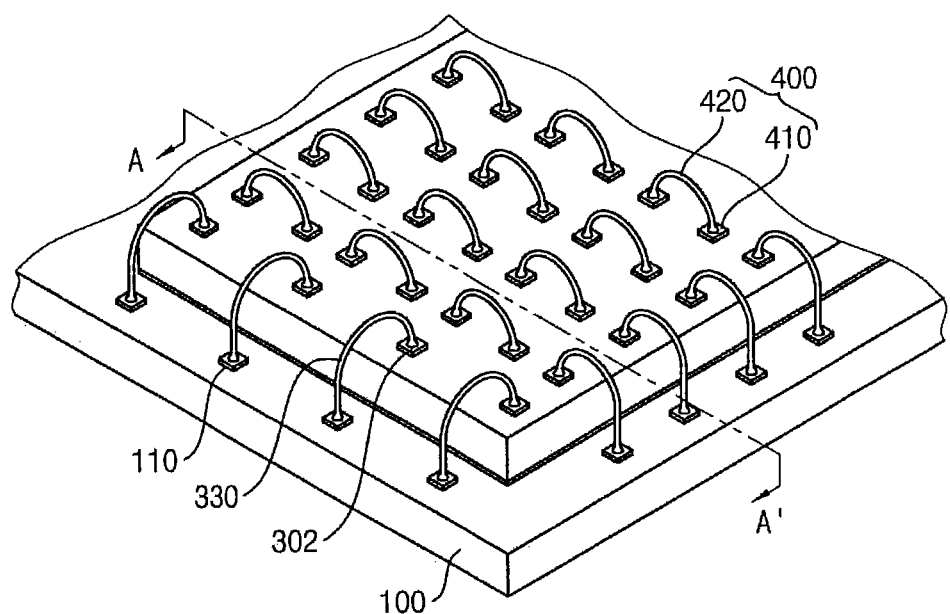
Figure 4:
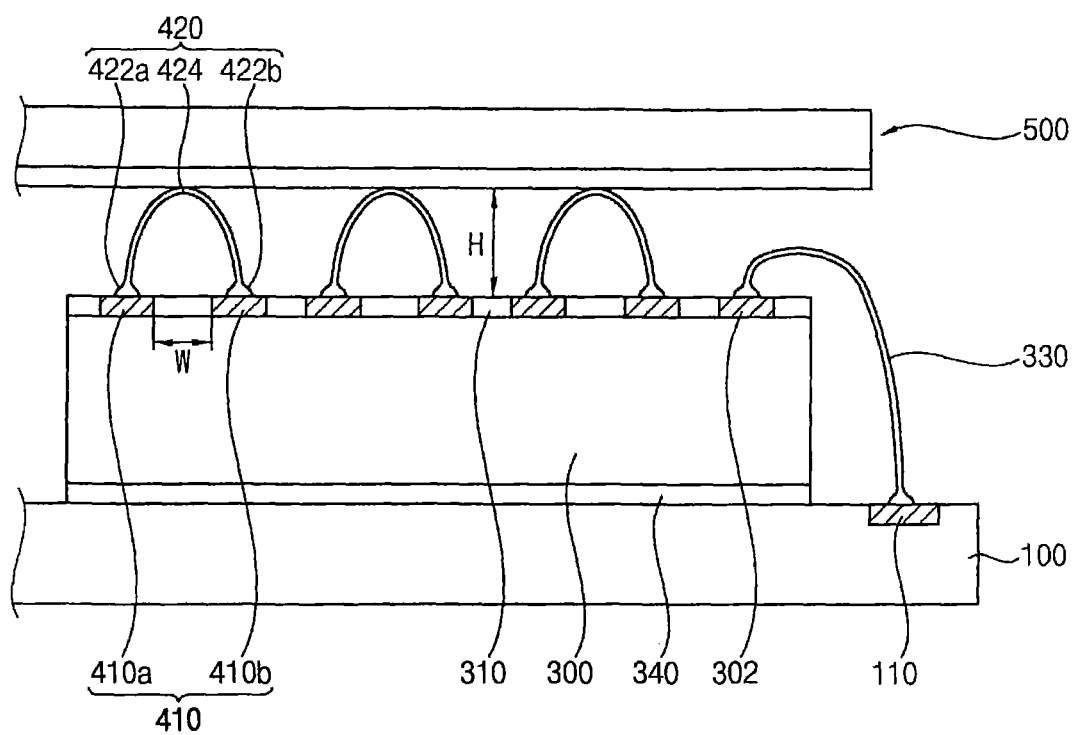

FIG. 1 is a cross-sectional view illustrating a semiconductor package in accordance with example embodiments of the inventive concept. FIG. 2 is a plan view illustrating the semiconductor package in FIG. 1. FIG. 3 is a perspective view illustrating a support structure of the semiconductor package in FIG. 1. FIG. 4 is a cross-sectional view taken along the line A-A' in FIG. 3.

Referring to FIG. 1, a semiconductor package 10 may include a package substrate 100, a plurality of first semiconductor chips 200, a second semiconductor chip 300, a support structure 400, a plurality of third semiconductor chips 500, and a molding member 600. Additionally, the semiconductor package 10 may further include conductive connection members 230, 330, 530 electrically connecting the first semiconductor chips 200, the second semiconductor chip 300 and the third semiconductor chips 500 to the package substrate 100.

In example embodiments, the package substrate 100 may be a substrate having an upper surface 102 and a lower surface 104 opposite to each other. For example, the package substrate 100 may include a printed circuit board (PCB), a flexible substrate, a tape substrate, etc. The printed circuit board may include a multi-layered circuit board having vias and various circuit elements therein.

Substrate pads 110 connected to a plurality of wirings of the package substrate 100 may be arranged on the upper surface 102 of the package substrate 100. The wirings may extend on the upper surface 102 of the package substrate 100 or extend within the package substrate. The substrate pads 110 may be connected to end portions of the wirings respectively. For example, at least a portion of the wiring may be used as the substrate pad, that is, a landing pad.

The wirings may include a power wiring or a ground wiring as a power net for supplying a power to electrical components mounted on the package substrate 100. The substrate pads 110 may include a power pad or a ground pad connected to the power wiring or the ground wiring. Additionally, the substrate pads 110 may further include a plurality of substrate signal wirings and substrate signal pads for transmitting data signals to the electrical components.

Although some substrate pads are illustrated in the figures, the number and locations of the substrate pads are illustrated as examples, and, thus, embodiments of the inventive concept are not limited thereto. It will be appreciated that the substrate signal pads and the wirings as well as the substrate pads are not illustrated in the figures and explanations concerning the above elements will be omitted for simplicity and brevity.

A first insulation layer 130 may be formed on the upper surface 102 of the package substrate 100 to cover the wirings and expose the substrate pads 110. The first insulation layer 130 may cover the entire upper surface 102 of the package substrate 100 except for the substrate pad 110. For example, the first insulation layer may include solder resist.

In example embodiments, a plurality of the first semiconductor chips 200 may be mounted on the package substrate 100. A plurality of the first semiconductor chips 200 may have a first height as measured from the package substrate.

For example, four first semiconductor chips 200a, 200b, 200c, 200d may be adhered onto the upper surface 102 of the package substrate 100 by adhesive members 240a, 240b, 240c, 240d. For example, the adhesive member may include an adhesive film, such as DAF (direct adhesive film).

The first semiconductor chip 200 may include chip pads 202 on an upper surface, which may be an active surface. The chip pads 202 may include an input/output terminal serving as a power pin or an input/output terminal serving as a ground pin.

The first semiconductor chip 200 may be electrically connected to the package substrate 100 by first conductive connection members 230. In particular, the first conductive connection member 230 may electrically connect the chip pad 202 of the first semiconductor chip 200 to the substrate pad 110 of the package substrate 100. For example, the first conductive connection member 230 may include a bonding wire. Accordingly, the first semiconductor chips 200 may be stacked on the package substrate 100 by the adhesive members and may be electrically connected to the package substrate 100 by a plurality of the first conductive connection members 230. Alternatively, the first conductive connection member may include one or more of a solder bump, a penetrating electrode, a solder ball, a conductive paste, etc.

The first semiconductor chip 200 may be a memory chip including a memory circuit. For example, the first semiconductor chip 200 may include volatile memory devices, such as DRAM devices. The number, sizes, locations, etc. of the first semiconductor chips are illustrated as examples, and, thus, embodiments of the inventive concept are not limited thereto.

In example embodiments, at least one second semiconductor chip 300 may be mounted on the package substrate 100. The second semiconductor chip 300 may be arranged so as to be spaced apart from the first semiconductor chip 200 on the package substrate 100. The second semiconductor chip 300 may have a second height less than the first height as measured from the package substrate 100. Accordingly, the upper surface of the first semiconductor chip 200 may be positioned higher than an upper surface of the second semiconductor chip 300 by a predetermined height H relative to a surface of the package substrate 100 on which the first semiconductor chip 200 and the second semiconductor chip 300 are formed. A thickness of the first semiconductor chip 200 may be less than a thickness of the second semiconductor chip 300.

The second semiconductor chip 300 may be adhered onto the upper surface 102 of the package substrate 100 by an adhesive member 340. The second semiconductor chip 300 may include an integrated circuit. For example, the second semiconductor chip 300 may be a logic chip including a logic circuit. The logic chip may be a controller for controlling memory chips.

The second semiconductor chip 300 may include chip pads 302 on the upper surface, that is, an active surface. The chip pads 302 may include an input/output terminal serving as a power pin, an input/output terminal serving as a ground pin or an input/output terminal serving as a data pin. Although some chip pads are illustrated, the number and locations of the chip pads are illustrated as examples, and, thus, embodiments of the inventive concept are not limited thereto. It will be appreciated that descriptions of the chip signal pads as well as the chip pads will be omitted for simplicity and brevity.

In example embodiments, the chip pads 302 may be a redistribution wiring pad. As illustrated in FIG. 4, the second semiconductor chip 300 may include a redistribution wiring layer 310, which is the uppermost layer thereof. The redistribution wiring layer 310 may include the chip pads 302. As described below, the redistribution wiring layer 310 may include dummy pads of the support structure 400.

The second semiconductor chip 300 may be electrically connected to the package substrate 100 by second conductive connection members 330. In some embodiments, the second conductive connection member 330 may electrically connect the chip pad 302 of the second semiconductor chip 300 to the substrate pad 110 of the package substrate 100. For example, the second conductive connection member 330 may include a bonding wire. Accordingly, the second semiconductor chips 300 may be stacked on the package substrate 100 by the adhesive member 340 and may be electrically connected to the package substrate 100 by a plurality of the second conductive connection members 330.

In some embodiments, the third conductive connection member may include one or more of a solder bump, a penetrating electrode, a solder ball, a conductive paste, etc. For example, the second semiconductor chip may be mounted on the package substrate 100 in a flip chip bonding manner. In this case, the second semiconductor chip may be arranged on the package substrate 100, such that the active surface of the second semiconductor chip on which the chip pads are formed faces the package substrate 100. The chip pads of the second semiconductor chip may be electrically connected to the substrate pads of the package substrate 100 by the conductive bumps, for example, solder bumps. Dummy pads of the support structure 400 may formed on a back surface opposite to the active surface. Additionally, a plurality of the second semiconductor chips may be sequentially stacked on the package substrate 100.

In example embodiments, the support structure 400 may be arranged on the second semiconductor chip 300. The support structure 400 may be arranged between the second semiconductor chip 300 and the lowermost third semiconductor chip 500a of the third semiconductor chips 500 to support the third semiconductor chips 500. The first height of the first semiconductor chips 200 may be approximately equal to a sum of the height H of the support structure 400 and the second height of the second semiconductor chip 300.

In particular, the support structure 400 may include at least two dummy pads 410a, 410b on the second semiconductor chip 300 and a dummy wire 420 to support the lowermost third semiconductor chip 500a. First and second end portions 422a, 422b of the dummy wire 420 may be adhered to the dummy pads 410a, 410b, respectively. The first and second end portions 422a, 422b of the dummy wire 420 may be adhered to the upper surface of the second semiconductor chip 300. A curved portion 424 of the dummy wire 420 may extend upward to make contact with a lower surface of an overhanging portion of the third semiconductor chip 500. For example, the curved portion 424 of the dummy wire 420 may have a U-shape and may support the overhanging portion.

For example, the pair of the dummy pads 410a, 410b may be arranged on the upper surface of the second semiconductor chip 300. The pair of the dummy pads 410a, 410b may be arranged in one direction. The pair of the dummy pads 410a, 410b may be spaced apart from each other by a predetermined distance W. The first and second end portions 422a, 422b of the dummy wire 420 may be adhered to the pair of the dummy pads 410a, 410b, respectively. The curved portion 424 of the dummy wire 420 may extend upward from the first and second end portions 422a, 422b to have a height H capable of supporting the overhanging portion of the third semiconductor chip 500.

The pair of the dummy pads 410a, 410b may be arranged at a desired position on the upper surface of the second semiconductor chip 300. The dummy wire 420 connected to the pair of the dummy pads 410a, 410b may have the predetermined height H according to a height difference defined by the overhanging portion of the third semiconductor chip 500.

The distance W between the pair of the dummy pads 410a, 410b and a thickness of the dummy wire 420 may be selected based on a length, a thickness, etc. of the overhanging portion of the third semiconductor chip 500.

The dummy wire 420 may have a thickness the same as or greater than a thickness of the bonding wire. The dummy wire 420 may be formed using a material having excellent strength and high thermal conductivity. For example, the dummy wire 420 may be formed using a material the same as the bonding wire. Alternatively, the dummy wire 420 may be formed using a nonconductive material.

The dummy pad may be formed using a material the same as the chip pad. Alternatively, the dummy pad may be adhered onto the second semiconductor chip using a nonconductive adhesive film. The nonconductive adhesive film may include a polyimide film.

In example embodiments, a plurality of the third semiconductor chips 500 may be stacked on the first semiconductor chip 200 and the support structure 400. The third semiconductor chips 500 may be mounted on the package substrate 100 and supported by the support structure 400. The third semiconductor chips 500a, 500b, 500c, 500d may be adhered on the support structure 400 using adhesive members 540a, 540b, 540c, 540d. For example, the adhesive member may include an adhesive film, such as DAF (direct adhesive film). The third semiconductor chip 500 may have a relatively large area to at least partially cover and, in some embodiments, entirely cover the first semiconductor chip 200 and the second semiconductor chip 300 in a plan view of the semiconductor package 10.

The third semiconductor chip 500 may include chip pads 502 on the upper surface, that is, an active surface. The chip pads 502 may include an input/output terminal serving as a power pin, an input/output terminal serving as a ground pin or an input/output terminal serving as a data pin.

The third semiconductor chip 500 may be electrically connected to the package substrate 100 by third conductive connection members 530. In particular, the third conductive connection member 530 may electrically connect the chip pad 502 of the third semiconductor chip 500 to the substrate pad 110 of the package substrate 100. For example, the third conductive connection member 530 may include a bonding wire. Accordingly, the third semiconductor chips 500 may be stacked on the support structure 400 by the adhesive member and may be electrically connected to the package substrate 100 by a plurality of the third conductive connection members 500.

The third semiconductor chips 500 may be memory chips including a memory circuit. For example, the third semiconductor chips 500 may include non-volatile memory devices, such as NAND devices. The number, sizes, locations, etc. of the third semiconductor chips are illustrated as examples, and, thus, embodiments of the inventive concept are not limited thereto.

In example embodiments, the molding member 600 may be formed on the package substrate 100 to protect the first semiconductor chips 200, the second semiconductor chip 300, the support structure 400 and the third semiconductor chips 500 from the surrounding environment. The molding member may include epoxy molding compound (EMC).

Outer connection pads 120 for supplying an electrical signal may be formed on the lower surface 104 of the package substrate 100. The outer connection pads 120 may be exposed from a second insulation layer 140. The second insulation layer 140 may include one or more of a silicon oxide layer, a silicon nitride or a silicon oxynitride layer. An outer connection member 700 for electrical connection with an external device may be disposed on the outer connection pad 120 of the package substrate 100. For example, the outer connection member 700 may include a solder ball. The semiconductor package 10 may be mounted on a module substrate (not illustrated) via the solder balls to form a memory module.

As described above, the semiconductor package 10 may include the first semiconductor chips 200 having a first height, the second semiconductor chip 300 having a second height less than the first height, the support structure 400 arranged on the second semiconductor chip 300, and the third semiconductor chips 500 supported by the support structure 400. The support structure 400 may be arranged on the second semiconductor chip 300 having a relatively smaller height to compensate the height difference between the first semiconductor chips 200 and to support the overlying third semiconductor chips 300.

Accordingly, the support structure 400, which is substituted for a conventional spacer chip for supporting the overlying chip, may be formed during a wiring boding process, to thereby reduce costs and improve productivity.

Figure 5:
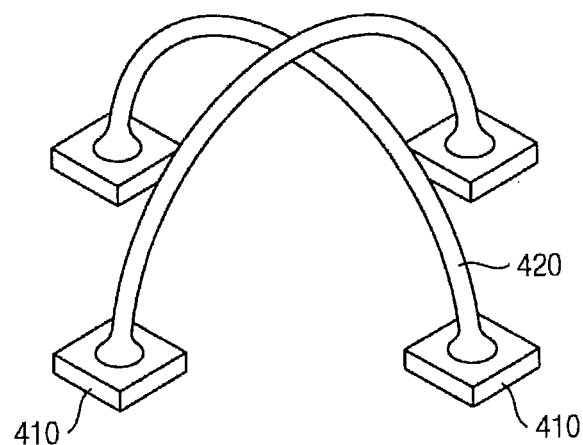
Figure 6:
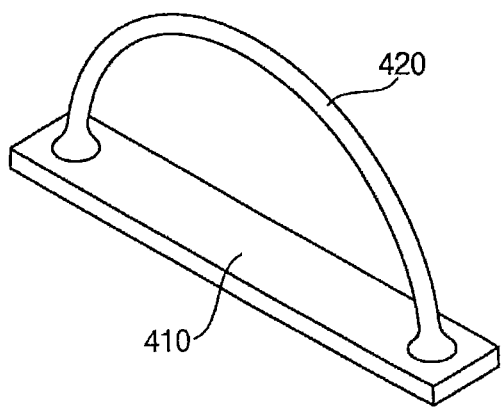

FIGS. 5 and 6 are perspective views illustrating various shapes of the support structure in FIG. 3 according to different embodiments of the inventive concept.

Referring to FIG. 5, the support structure 400 may include four dummy pads 410 and two dummy wires 420.

The four dummy pads 410 may be arranged on the upper surface of the second semiconductor chip 300. First and second end portions of a first dummy wire 420 may be adhered to a pair of the dummy pads 410 respectively, and first and second end portions of a second dummy wire 420 may be adhered to a pair of the dummy pads 410 respectively. Accordingly, two first and second dummy wires 420 may support the overhanging portion of the third semiconductor chip 500 together.

Referring to FIG. 6, the support structure 400 may include one dummy pad 410 and one dummy wire 420.

The one dummy pad 410 may have a rectangular shape extending in one direction. A first end portion of the dummy wire 420 may be adhered to a first end portion of the dummy pad 410, and a second end portion of the dummy wire 420 may be adhered to a second end portion of the dummy pad 410.

Hereinafter, a method of manufacturing the semiconductor package in FIG. 1 according to some embodiments of the inventive concept will be described.

FIGS. 7 to 11 are views illustrating a method of manufacturing a semiconductor package in accordance with example embodiments of the inventive concept.

Figure 7:
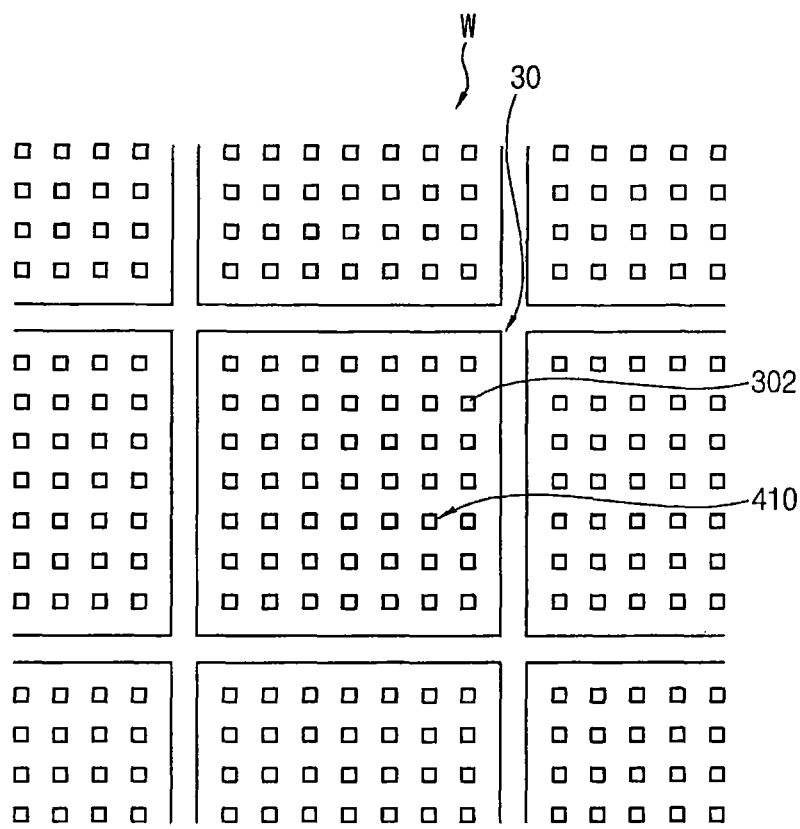
Figure 8:
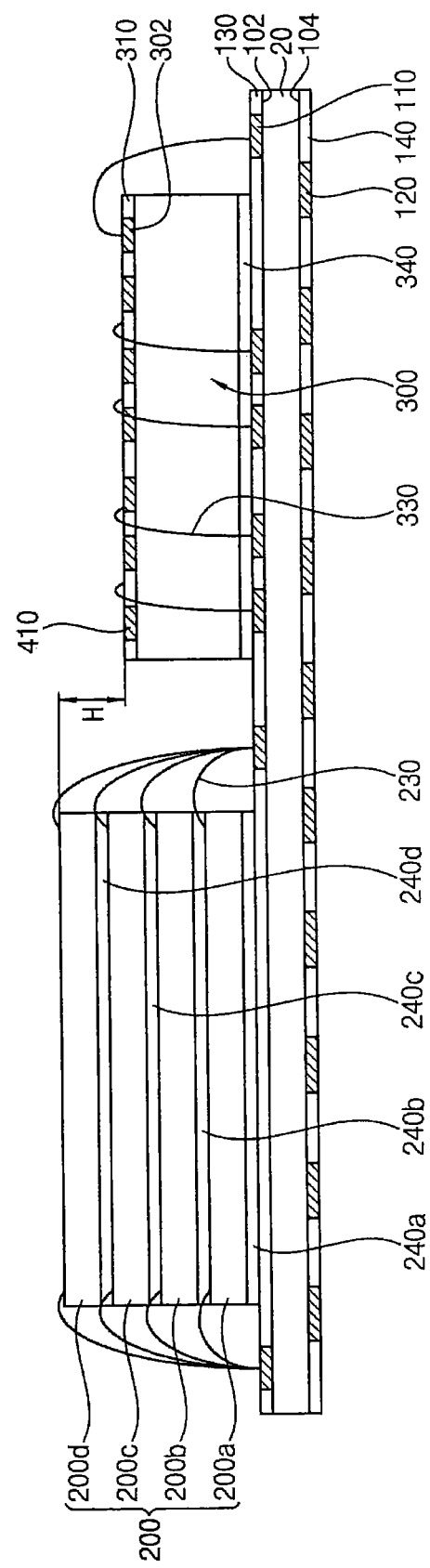

Referring to FIG. 7, first, a semiconductor manufacturing process may be performed on a semiconductor wafer W to form a plurality of semiconductor chips 30, and then, the semiconductor wafer may be cut by a sawing process into an individual second semiconductor chip 300 (see FIG. 8).

In example embodiments, a BEOL (back-end-of-line) process of the semiconductor manufacturing process may be performed on a redistribution wiring layer on the wafer. The redistribution wiring layer may include redistribution pads 302 as a bonding pad and dummy pads 410. Then, a backside of the wafer may be removed by a planarization process so as to have a desired thickness. Then, the wafer may be cut by a sawing process into the individual second semiconductor chip 300.

Referring to FIG. 8, first semiconductor chips 200 and a second semiconductor chip 300 may be stacked on a semiconductor substrate 20.

Four first semiconductor chips 200a, 200b, 200c, 200d may be adhered onto an upper surface 102 of the semiconductor substrate 20 using adhesive members 240a, 240b, 240c, 240d. The second semiconductor chip 300 may be adhered onto the upper surface 102 of the semiconductor substrate 20 using an adhesive member 340 to be spaced apart from the first semiconductor chip 200. The first semiconductor chips 200 may have a first height as measured from the semiconductor substrate 20, and the second semiconductor chip 300 may have a second height less than the first height as measured from the semiconductor substrate 20. Accordingly, an upper surface of the first semiconductor chip 200 may be positioned higher than an upper surface of the second semiconductor chip 300 by a predetermined height H relative to an upper surface of the substrate 20.

Then, by performing a wiring bonding process, chip pads of the first semiconductor chip 200 and chip pads 302 of the second semiconductor chip 300 may be connected to substrate pads 110 on the upper surface 102 of the semiconductor substrate 20. The chip pads of the first semiconductor chip 200 may be connected to the substrate pads 110 by first conductive connection members 230. The chip pads 302 of the second semiconductor chip 300 may be connected to the substrate pads 110 by second conductive connection members 330. The first and second conductive connection members may include a bonding wire.

Figure 9:
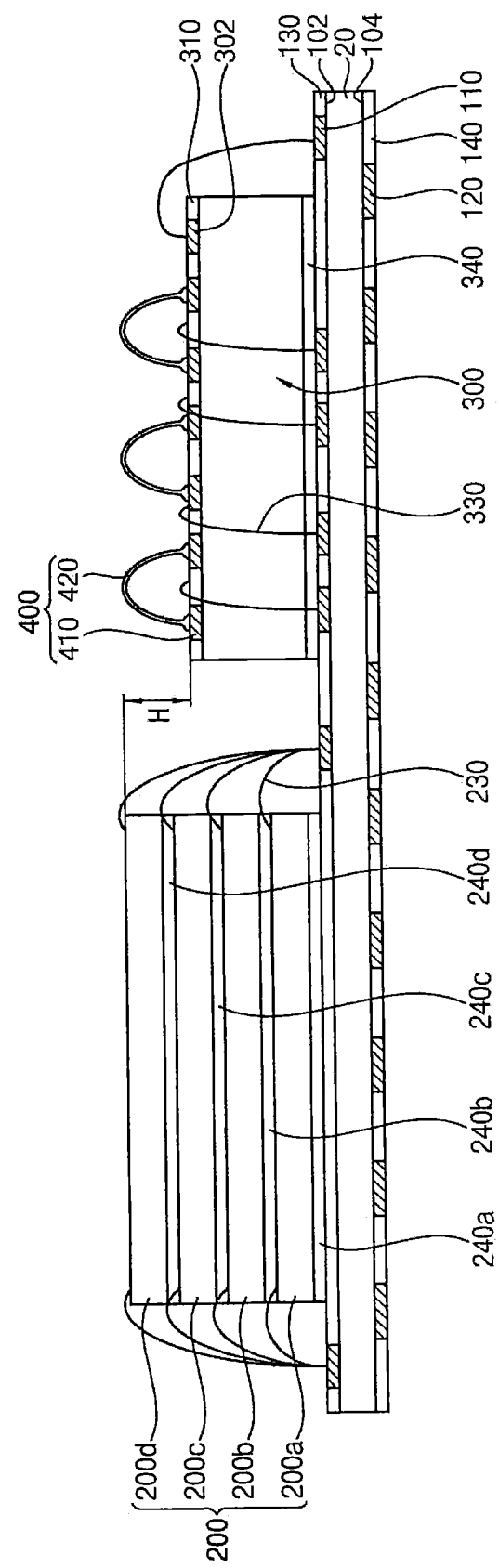

Referring to FIG. 9, at least one support structure 400 may be arranged on the second semiconductor chip 300.

By performing a wiring bonding process, first and second end portions of a dummy wire 420 may be adhered to two dummy pads 410 respectively to form the support structure 400. The first height of the first semiconductor chips 200 may be approximately equal to a sum of a height H of the support structure 400 and the second height of the second semiconductor chip 300.

A distance of a pair of the dummy pads 410 and a thickness of the dummy wire 420 may be determined based on a length, a thickness, etc. of an overhanging portion of a following third semiconductor chip 500.

The dummy wire 420 may have a thickness the same as or greater than a thickness of the bonding wire. The dummy wire 420 may be formed using a material having excellent strength and high thermal conductivity. For example, the dummy wire 420 may be formed using a material the same as the bonding wire. Alternatively, the dummy wire 420 may be formed using a nonconductive material.

The dummy pad may be formed using a material the same as the chip pad. Alternatively, the dummy pad may be adhered onto the second semiconductor chip using a nonconductive adhesive film. The nonconductive adhesive film may include a polyimide film.

Figure 10:
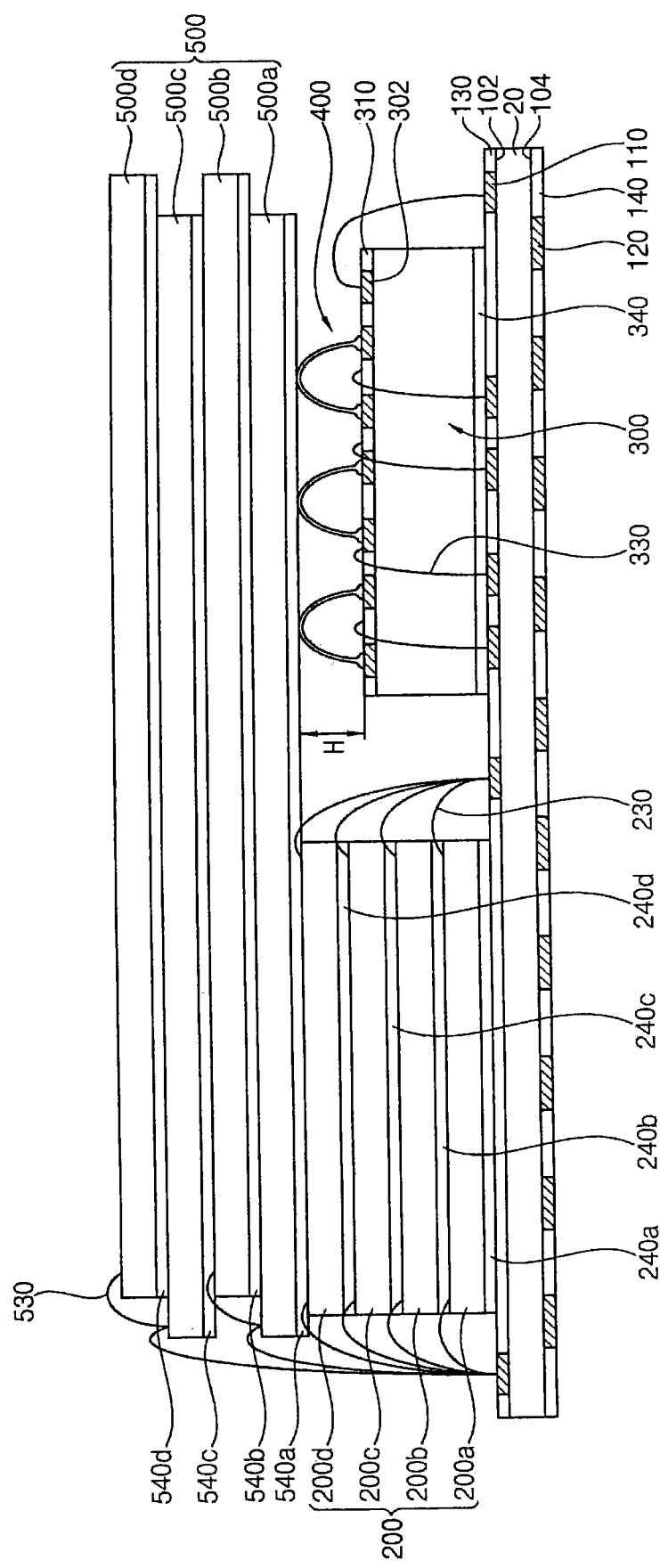

Referring to FIG. 10, a plurality of third semiconductor chips 500 may be stacked on the first semiconductor chip 200 and the support structure 400.

The third semiconductor chips 500a, 500b, 500c, 500d may be adhered on the first semiconductor chip 200 and the support structure 400 using adhesive members 540a, 540b, 540c, 540d. Accordingly, the third semiconductor chips 500a, 500b, 500c, 500d may be mounted on the semiconductor substrate 20 by way of the support structure 400. The third semiconductor chips may be offset sequentially or in a zigzag manner to each other. An area of the third semiconductor chip may be greater than an area of the first semiconductor chip or the second semiconductor chip.

Then, by performing a wire bonding process, chip pads of the third semiconductor chips 500a, 500b, 500c, 500d may be connected to the substrate pads 110 on the upper surface 102 of the semiconductor substrate 20. The chip pads of the third semiconductor chips 500a, 500b, 500c, 500d may be connected to the substrate pads 110 by third conductive connection members 560.

Figure 11:
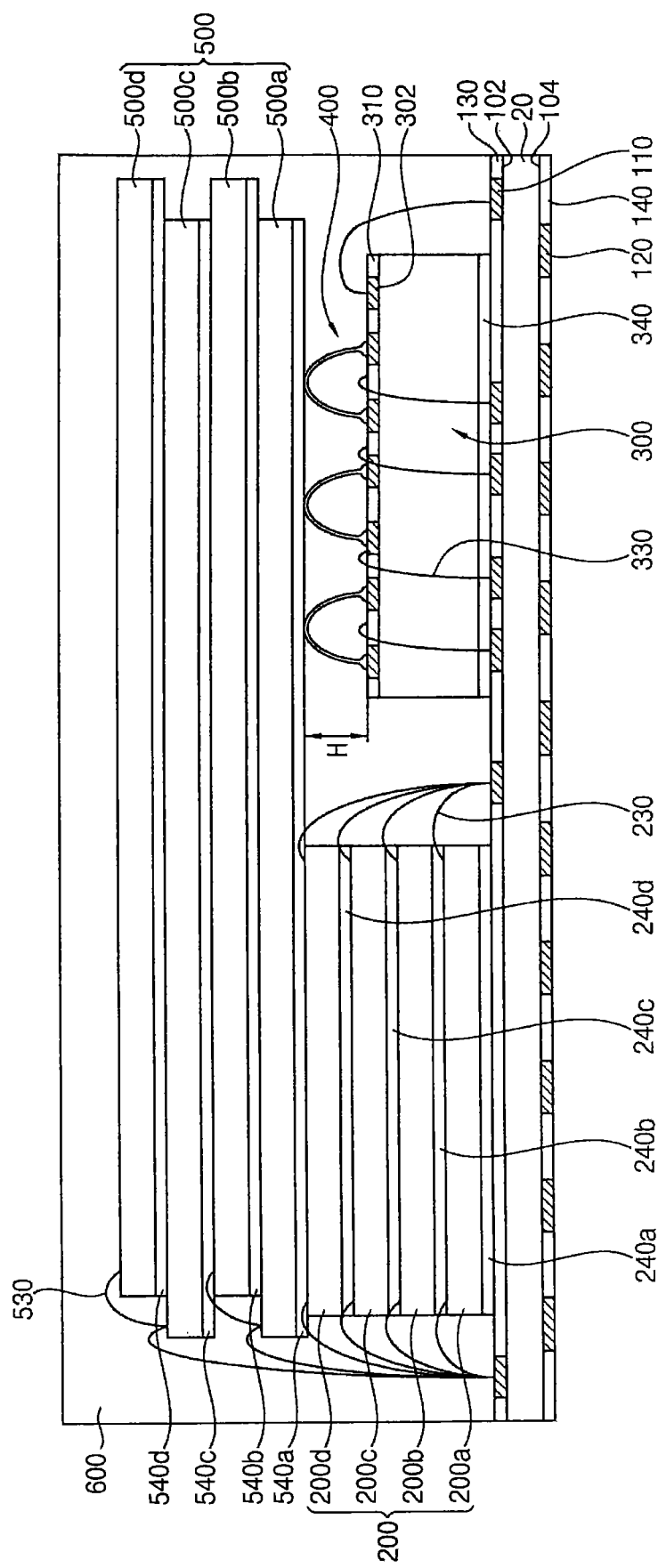

Referring to FIG. 11, a molding member 600 may be formed on the semiconductor substrate 20 to cover the first semiconductor chips 200, the second semiconductor chip 300, the support structure 400 and the third semiconductor chips 500. Then, after outer connection members 700 are disposed on outer connection pads 120 on a lower surface 104 of the semiconductor substrate 20, the semiconductor substrate 20 may be cut by a sawing process into individual semiconductor packages.

For example, the molding member may be formed on the semiconductor substrate 20 by a molding process to cover the first semiconductor chips 200, the second semiconductor chip 300, the support structure 400 and the third semiconductor chips 500. The molding member may include epoxy molding compound (EMC).

Figure 12:
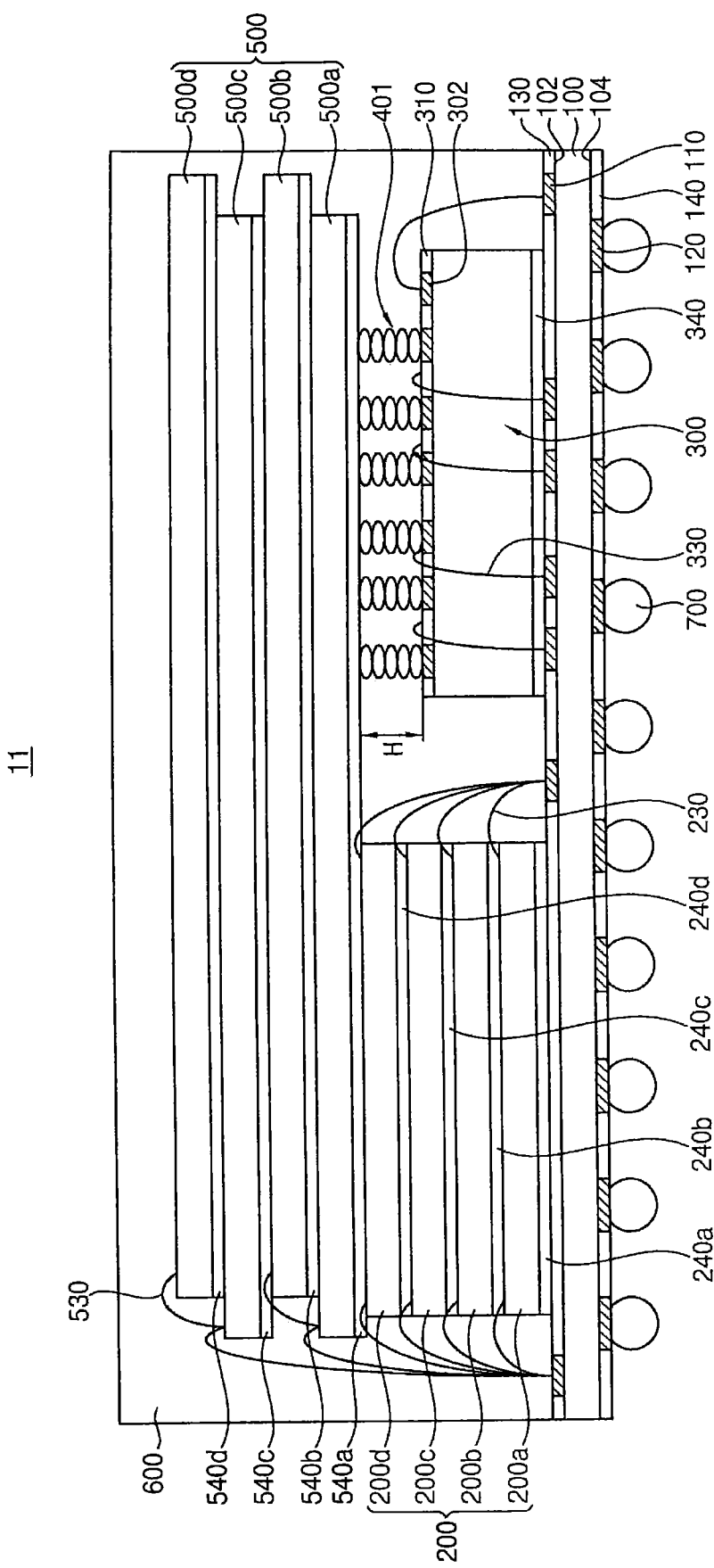
Figure 13:
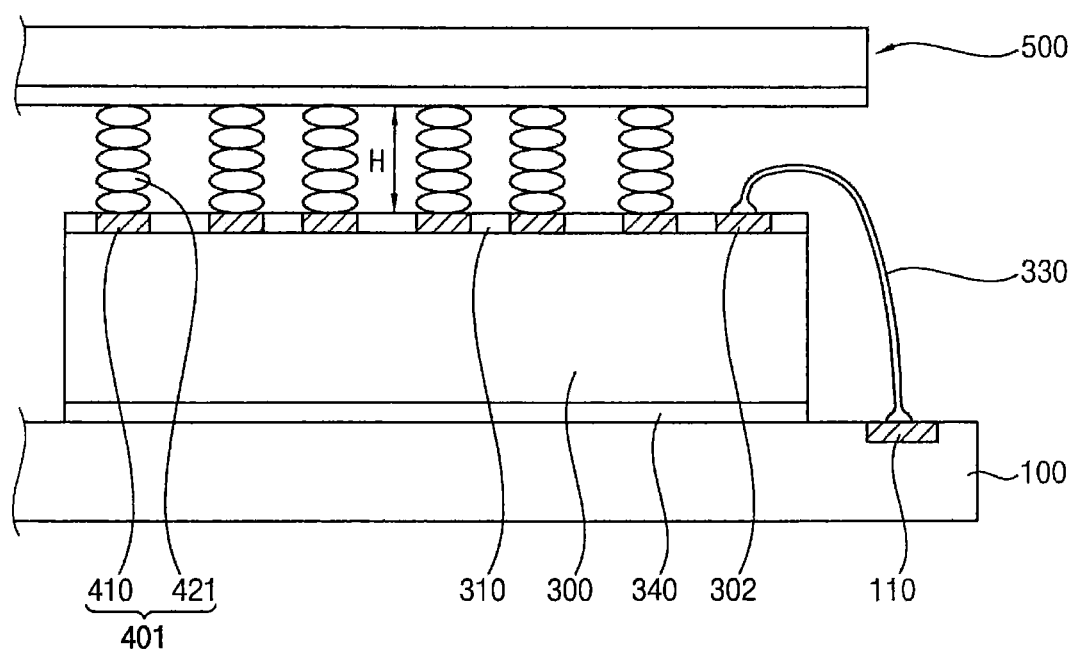

FIG. 12 is a cross-sectional view illustrating a semiconductor package in accordance with example embodiments of the inventive concept. FIG. 13 is a cross-sectional view illustrating a support structure of the semiconductor package in FIG. 12. The semiconductor package may be substantially the same as or similar to the semiconductor package embodiments described with reference to FIGS. 1 to 4 except for a configuration of a support structure. Thus, the same reference numerals will be used to refer to the same or like elements and any further repetitive description concerning the above elements will be omitted.

Referring to FIGS. 12 and 13, a support structure 401 of a semiconductor package 11 may include at least one dummy pad 410 on a second semiconductor chip 300 and a plurality of dummy bumps 421 sequentially stacked on the dummy pad 410. The dummy bumps 421 may be sequentially stacked to have a predetermined height H. The dummy bumps 421 may extend upward from the dummy pad 410 to make contact with a lower surface of an overhanging portion of a third semiconductor chip 500.

Hereinafter, a method of manufacturing the semiconductor package in FIG. 12 will be described.

Figure 14:
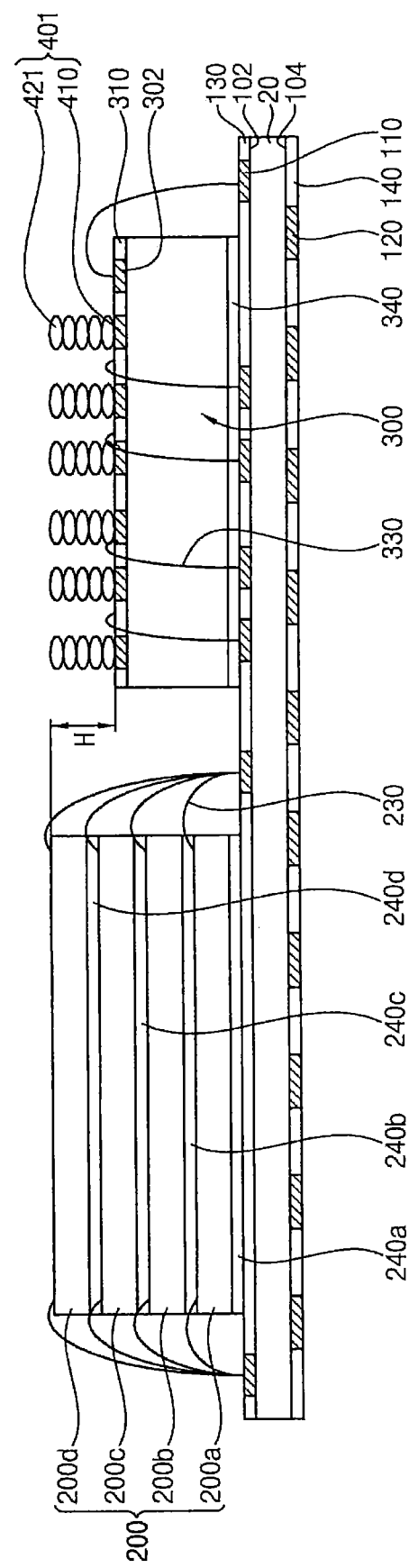
Figure 15:
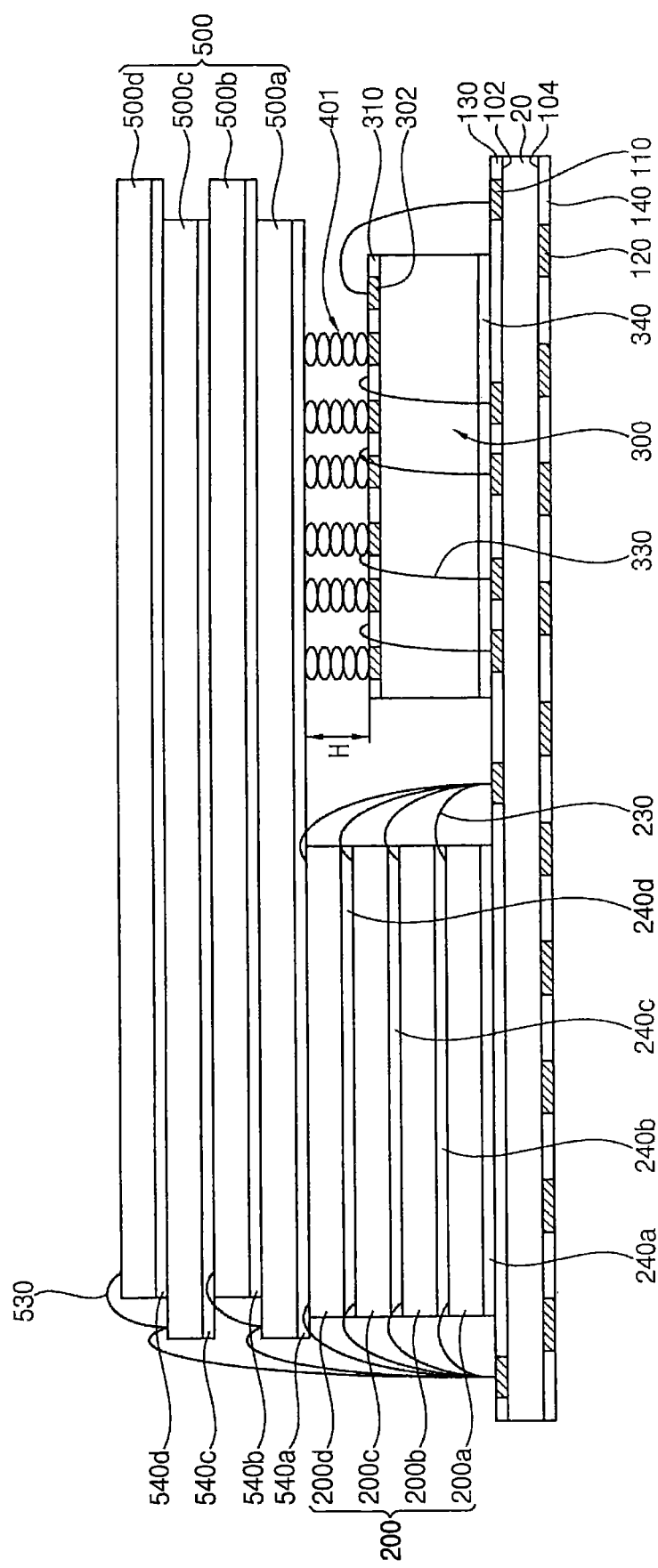

FIGS. 14 and 15 are cross-sectional views illustrating a method of manufacturing a semiconductor package in accordance with example embodiments of the inventive concept.

Referring to FIG. 14, first, the processes described with reference to FIGS. 7 and 8 may be performed, and then, at least one support structure 401 may be arranged on a second semiconductor chip 300.

In example embodiments, a wire bonding process may be performed to sequentially stack a plurality of dummy bumps 421 on the dummy pad 410.

In some embodiments, one bump 421 may be formed on the dummy pad 410 by a discharge of a ball forming portion, such as an electric torch on a distal portion of a wire that extends out of a lower end of a capillary of a wire bonding apparatus. The capillary may be moved to a point above the bump 421 and then may provide a distal portion of the wire on the bump 421 to stack a new bump on the bump 421. The processes may be performed repeatedly to form a plurality of the dummy bumps 421 on the one dummy pad 410.

The number of the dummy bumps 421, a thickness of the dummy bump 421, etc. may be determined based on a length, a thickness, etc. of an overhanging portion of a following third semiconductor chip 500.

Referring to FIG. 15, a plurality of the third semiconductor chips 500 may be stacked on the first semiconductor chip 200 and the support structure 401.

The third semiconductor chips 500a, 500b, 500c, 500d may be adhered on the first semiconductor chip 200 and the support structure 401 using adhesive members 540a, 540b, 540c, 540d. Accordingly, the third semiconductor chips 500a, 500b, 500c, 500d may be mounted on a semiconductor substrate 20 by way of the support structure 401.

Then, a molding member may be formed on the semiconductor substrate 20 to cover the first semiconductor chips 200, the second semiconductor chip 300, the support structure 401 and the third semiconductor chips 500. Then, after outer connection members 700 are disposed on outer connection pads 120 on a lower surface 104 of the semiconductor substrate 20, the semiconductor substrate 20 may be cut by a sawing process into individual semiconductor packages.

Figure 16:
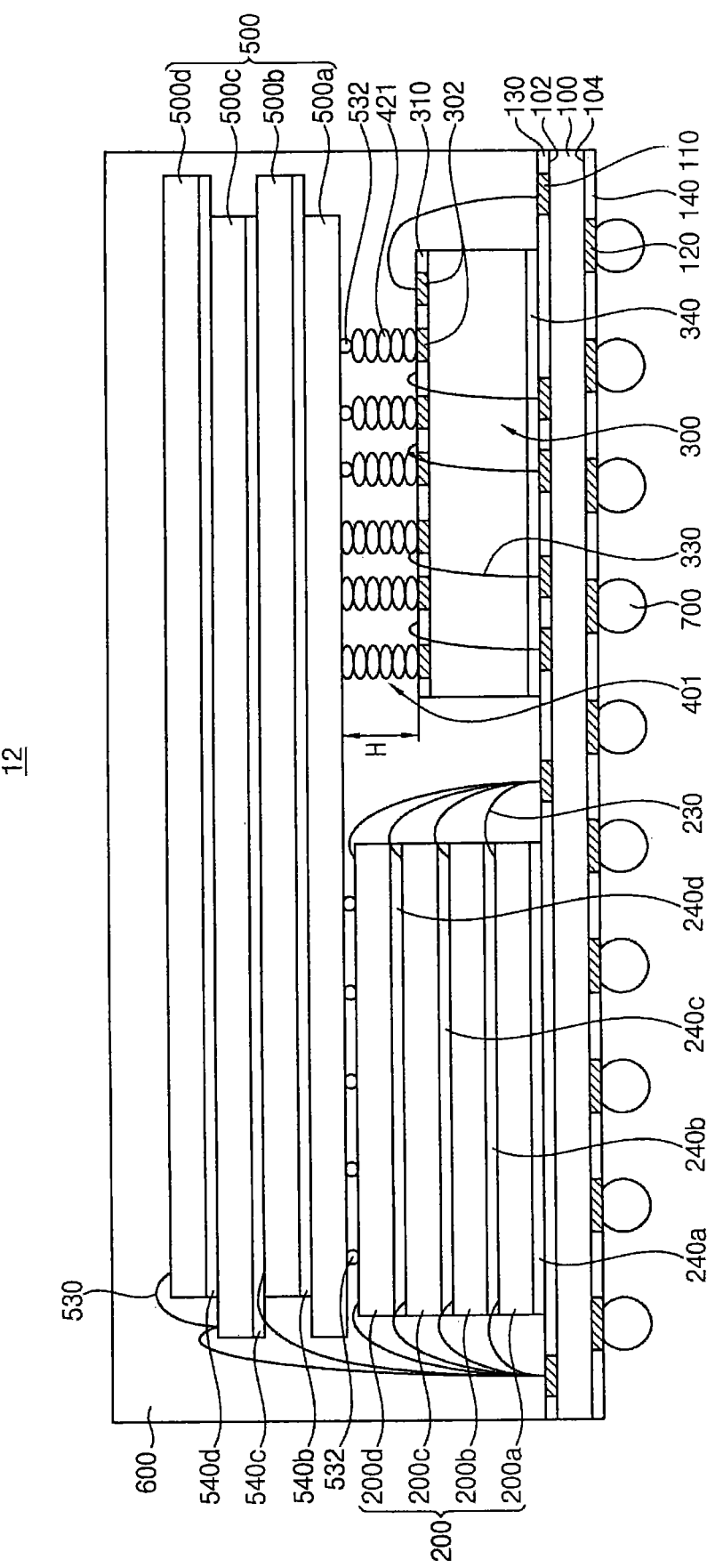
Figure 17:
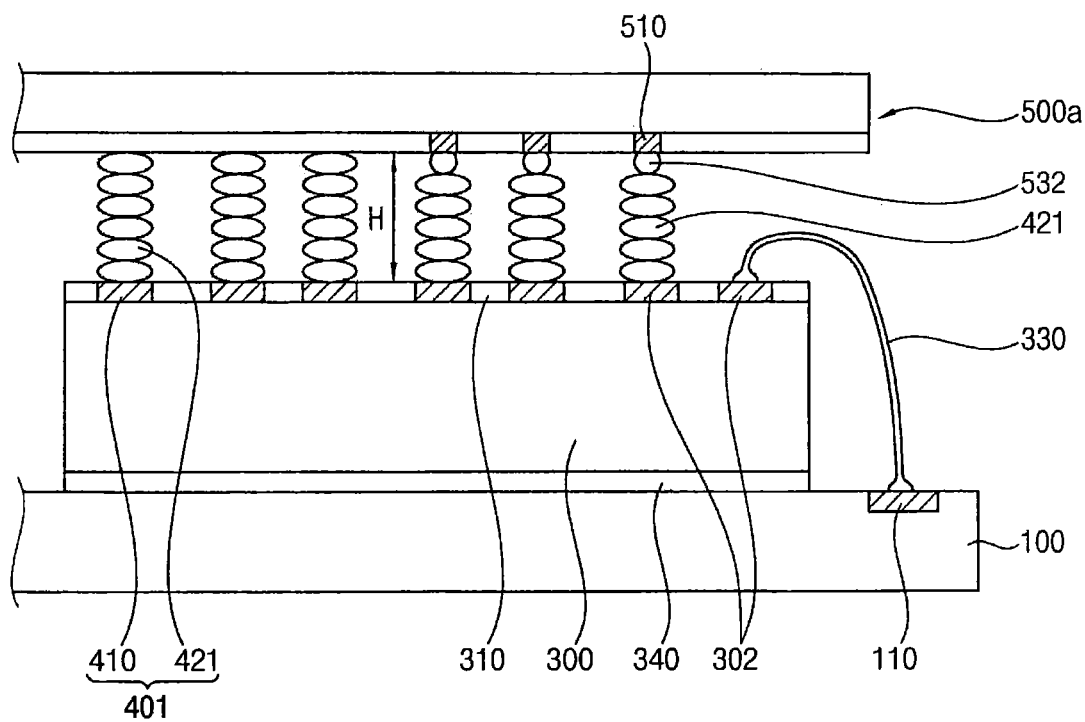

FIG. 16 is a cross-sectional view illustrating a semiconductor package in accordance with example embodiments of the inventive concept. FIG. 17 is a cross-sectional view illustrating a support structure of the semiconductor package in FIG. 16. The semiconductor package may be substantially the same as or similar to the semiconductor package embodiments described with reference to FIG. 12 except for a mounting manner of the third semiconductor chips 500. Thus, the same reference numerals will be used to refer to the same or like elements and any further repetitive explanation concerning the above elements will be omitted.

Referring to FIGS. 16 and 17, a plurality of third semiconductor chips 500 of a semiconductor package 12 may be mounted on a first semiconductor chip 200 and a support structure 401 in a flip chip bonding manner. The third semiconductor chips 500 may be stacked on the first semiconductor chip 200 and the support structure 401 via solder bumps 532.

In particular, the third semiconductor chip 500 may be mounted on the first semiconductor chip 200 and the support structure 401 with the solder bumps 532 interposed between the uppermost first semiconductor chip 200d and the lowermost third semiconductor chip 500a and between the support structure 401 and the lowermost third semiconductor chip 500a.

The solder bump 532 may be interposed between a chip pad 510 of the lowermost third semiconductor chip 500a and a chip pad (not illustrated) on an upper surface of the uppermost first semiconductor chip 200d.

As illustrated in FIG. 17, the solder bumps 421 may be interposed between the lowermost third semiconductor chip 500a and one or more first dummy bumps 421 of a plurality of the dummy pumps 421. The solder bump 532 and first dummy bumps 421 of the plurality of the dummy bumps 421 may electrically connect the lowermost third semiconductor chip 500a and the second semiconductor chip 300. In this case, the first dummy bumps 421 may be stacked on a chip pad 302, not a dummy pad.

Second dummy bumps 421 of the plurality of the dummy pumps 421 may make contact with and support a lower surface of the lowermost third semiconductor chip 500a.

The lowermost third semiconductor chip 500a may be electrically connected to the package substrate 100 by the solder bumps 532. The lowermost third semiconductor chip 500a may be electrically connected to the second semiconductor chip 300 or the package substrate 100 by the solder bump 532 and the first dummy bumps 421. Other ones of the third semiconductor chips 500b, 500c, 500d may be electrically connected to the package substrate 100 by third conductive connection members 530. For example, the third conductive connection member 530 may include a bonding wire.

Hereinafter, a method of manufacturing the semiconductor package in FIG. 16 will be described.

Figure 18:
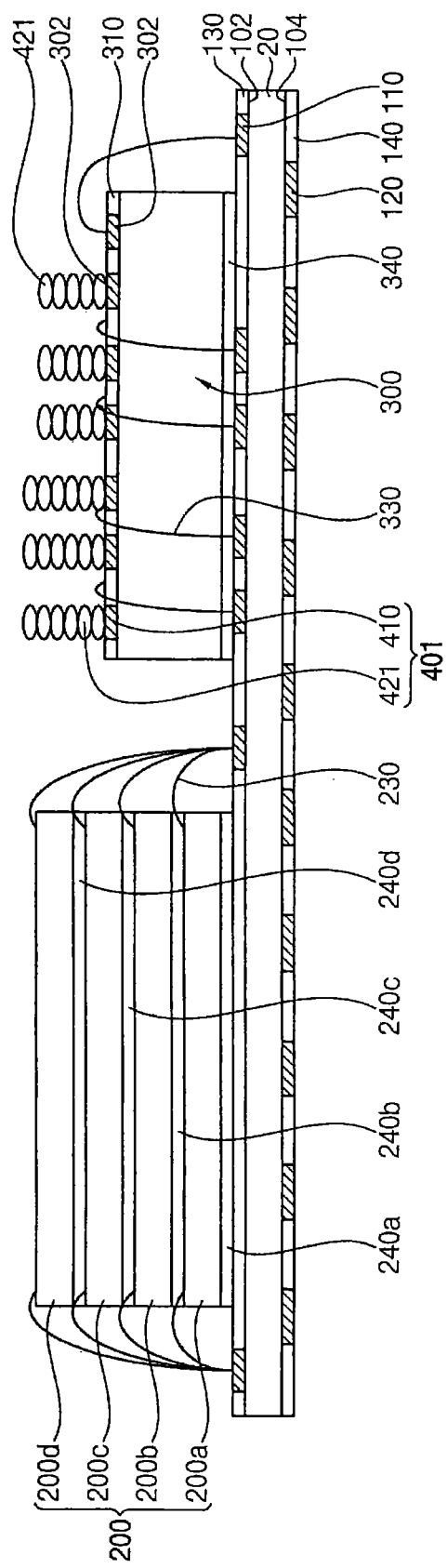
Figure 19:
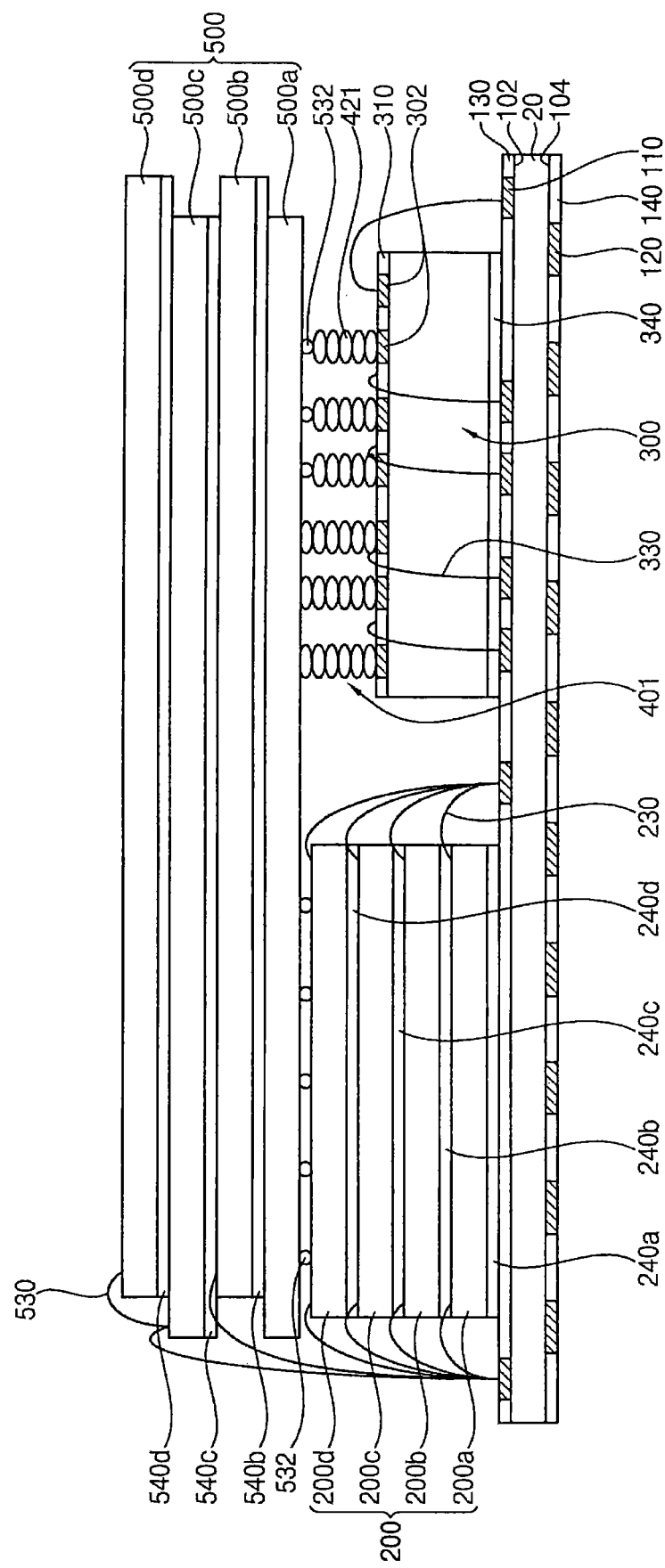

FIGS. 18 and 19 are cross-sectional views illustrating a method of manufacturing a semiconductor package in accordance with example embodiments of the inventive concept.

Referring to FIG. 18, first, the processes described with reference to FIGS. 7 and 8 may be performed, and then, at least one support structure 401 may be arranged on a second semiconductor chip 300.

In example embodiments, a wire bonding process may be performed to sequentially stack a plurality of dummy bumps 421 on chip pads 302 of the second semiconductor chip 300 and a dummy pad 410. First dummy bumps 421 of a plurality of dummy bumps 421 may be stacked on the chip pads 302 to be used for electrical signal transfer.

Referring to FIG. 19, a plurality of the third semiconductor chips 500 may be stacked on the first semiconductor chip 200 and the support structure 401.

In example embodiments, a plurality of the third semiconductor chips 500a, 500b, 500c, 500d may be mounted on the first semiconductor chip 200 and the support structure 401 in a flip chip bonding manner. The third semiconductor chips 500 may be stacked on the first semiconductor chip 200 and the support structure 401 via solder bumps 532.

In some embodiments, bumps may be formed on chip pads of the lowermost third semiconductor chip 500a, and the third semiconductor chip 500 may be arranged on the first semiconductor chip 200 and the support structure 401, such that the bumps may be interposed between the uppermost first semiconductor chip 200d and the lowermost third semiconductor chip 500a and between the support structure 401 and the lowermost third semiconductor chip 500a.

Then, a solder reflow process may be performed to form the solder bump 532 between the chip pad of the lowermost third semiconductor chip 500a and a chip pad on an upper surface of the uppermost first semiconductor chip 200d, and to form the solder bumps 532 between the lowermost third semiconductor chip 500a and first dummy bumps 421 of a plurality of the dummy bumps 421. Accordingly, the lowermost third semiconductor chip 500a may be electrically connected to the semiconductor substrate 20 by the solder bumps 532.

Then, other ones of the third semiconductor chips 500b, 500c, 500d may be electrically connected to the semiconductor substrate 20 by third conductive connection members 530. For example, the third conductive connection member 530 may include a bonding wire.

Then, a molding member may be formed on the semiconductor substrate 20 to cover the first semiconductor chips 200, the second semiconductor chip 300, the support structure 401 and the third semiconductor chips 500. Then, after outer connection members 700 are disposed on outer connection pads 120 on a lower surface 104 of the semiconductor substrate 20, the semiconductor substrate 20 may be cut by a sawing process into individual semiconductor packages.

Figure 20:
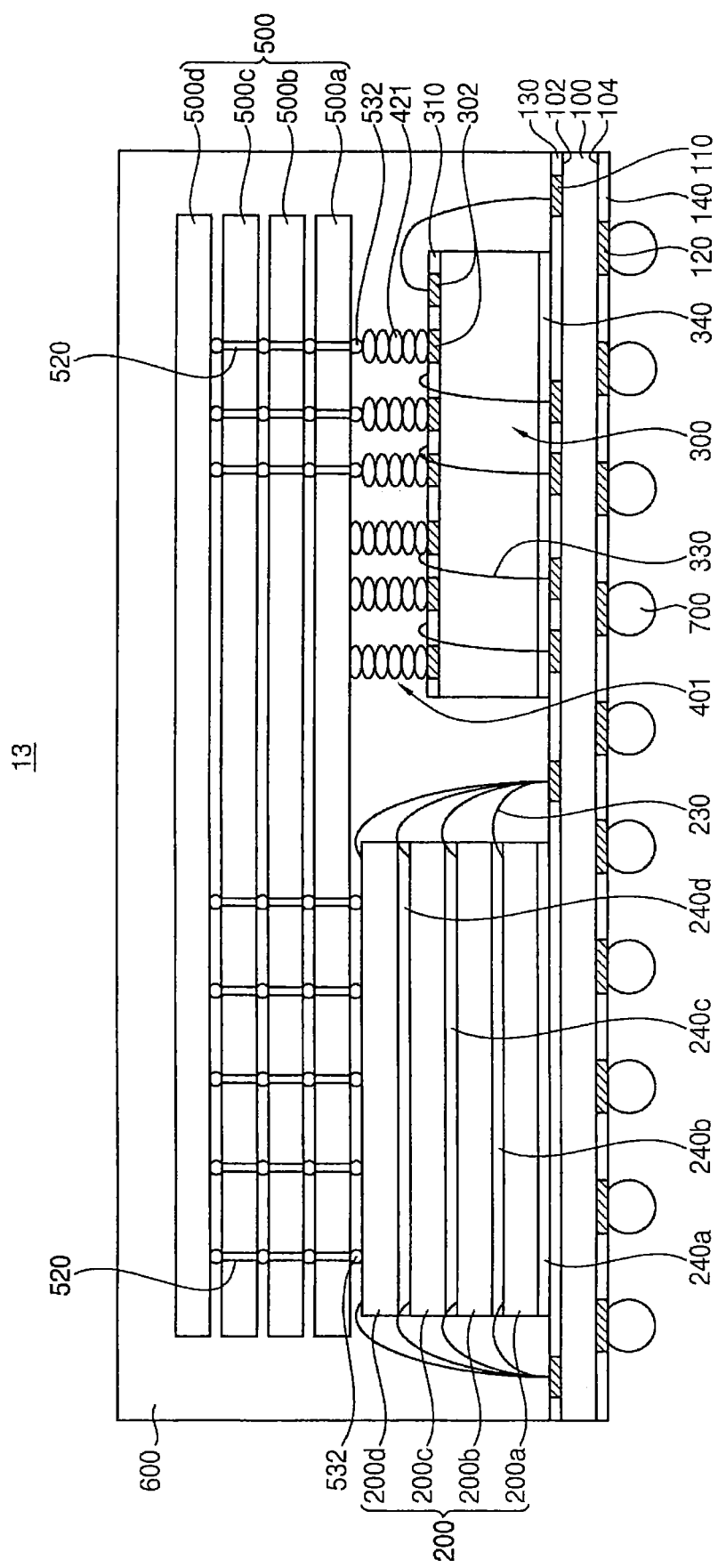
Figure 21:
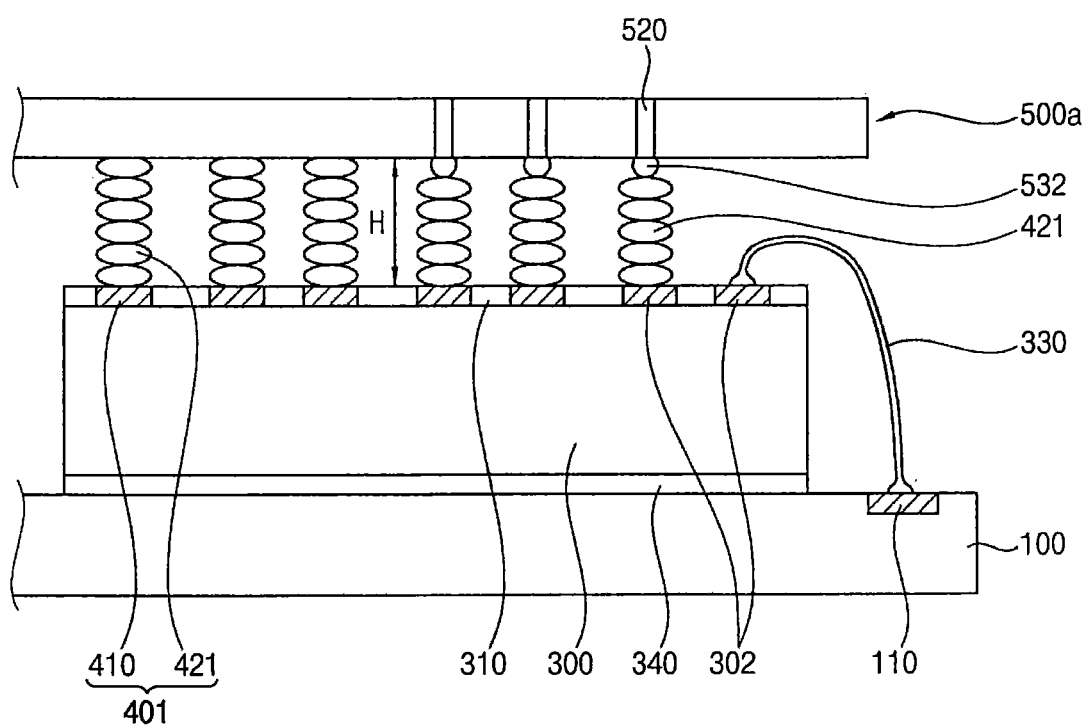

FIG. 20 is a cross-sectional view illustrating a semiconductor package in accordance with example embodiments of the inventive concept. FIG. 21 is a cross-sectional view illustrating a support structure of the semiconductor package in FIG. 20. The semiconductor package may be substantially the same as or similar to the semiconductor package embodiments described with reference to FIG. 16 except for an electrical interconnection of the third semiconductor chips 500. Thus, the same reference numerals will be used to refer to the same or like elements and any further repetitive explanation concerning the above elements will be omitted.

Referring to FIGS. 20 and 21, a plurality of third semiconductor chips 500 of a semiconductor package 13 may be mounted on a first semiconductor chip 200 and a support structure 401 in a flip chip bonding manner. The third semiconductor chips 500 may be stacked on the first semiconductor chip 200 and the support structure 401 via solder bumps 532. The third semiconductor chips 500 may be electrically connected to each other by silicon through vias (TSVs) 520. The TSVs 520 may be electrically connected to each other by solder bump 532. The third semiconductor chips 500 may communicate a data signal and a control signal through the TSVs 330.

The solder bump 532 may be interposed between the TSV 520 of the lowermost third semiconductor chip 500a and a chip pad (not illustrated) on an upper surface of the uppermost first semiconductor chip 200d.

As illustrated in FIG. 21, the solder bumps 532 may be interposed between the TSVs 520 of the lowermost third semiconductor chip 500a and first dummy bumps 421 of a plurality of the dummy bumps 421. The solder bumps 532 and the first dummy bumps 421 of the plurality of the dummy pumps 421 may electrically connect the lowermost third semiconductor chip 500a and the second semiconductor chip 300.

Second dummy bumps 421 of the plurality of the dummy pumps 421 may make contact with and support a lower surface of the lowermost third semiconductor chip 500a.

The lowermost third semiconductor chip 500a may be electrically connected to the package substrate 100 by the solder bumps 532. The lowermost third semiconductor chip 500a may be electrically connected to the second semiconductor chip 300 or the package substrate 100 by the solder bump 532 and the first dummy bumps 421. Other ones of the third semiconductor chips 500b, 500c, 500d may be electrically connected to the package substrate 100 by the TSVs 520.

Hereinafter, a method of manufacturing the semiconductor package in FIG. 20 will be described.

Figure 22:
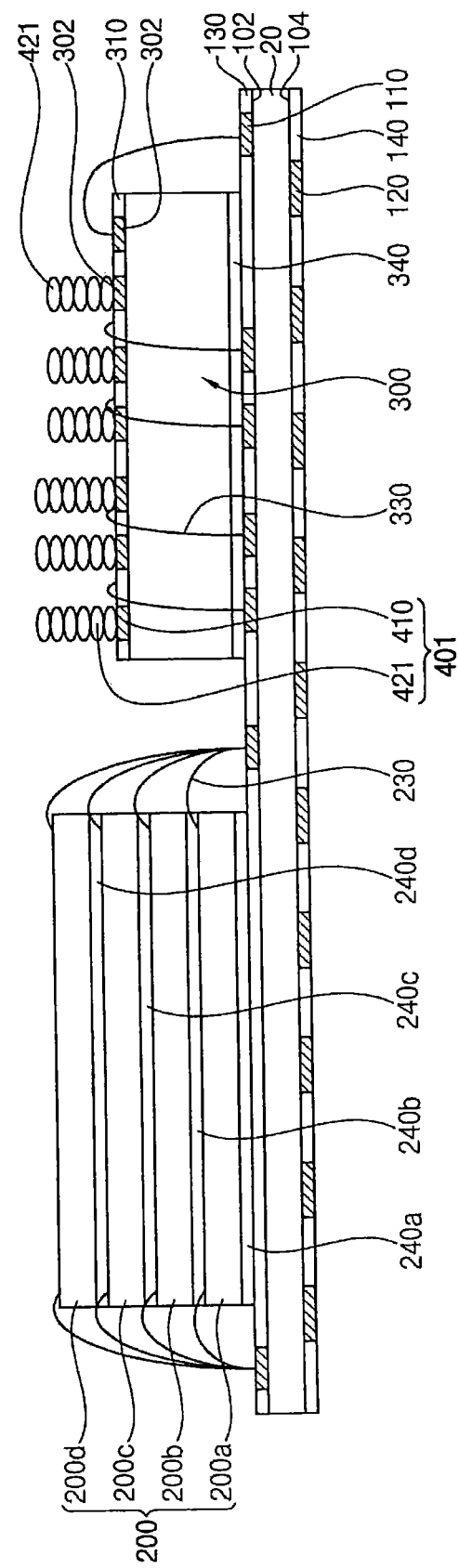
Figure 23:
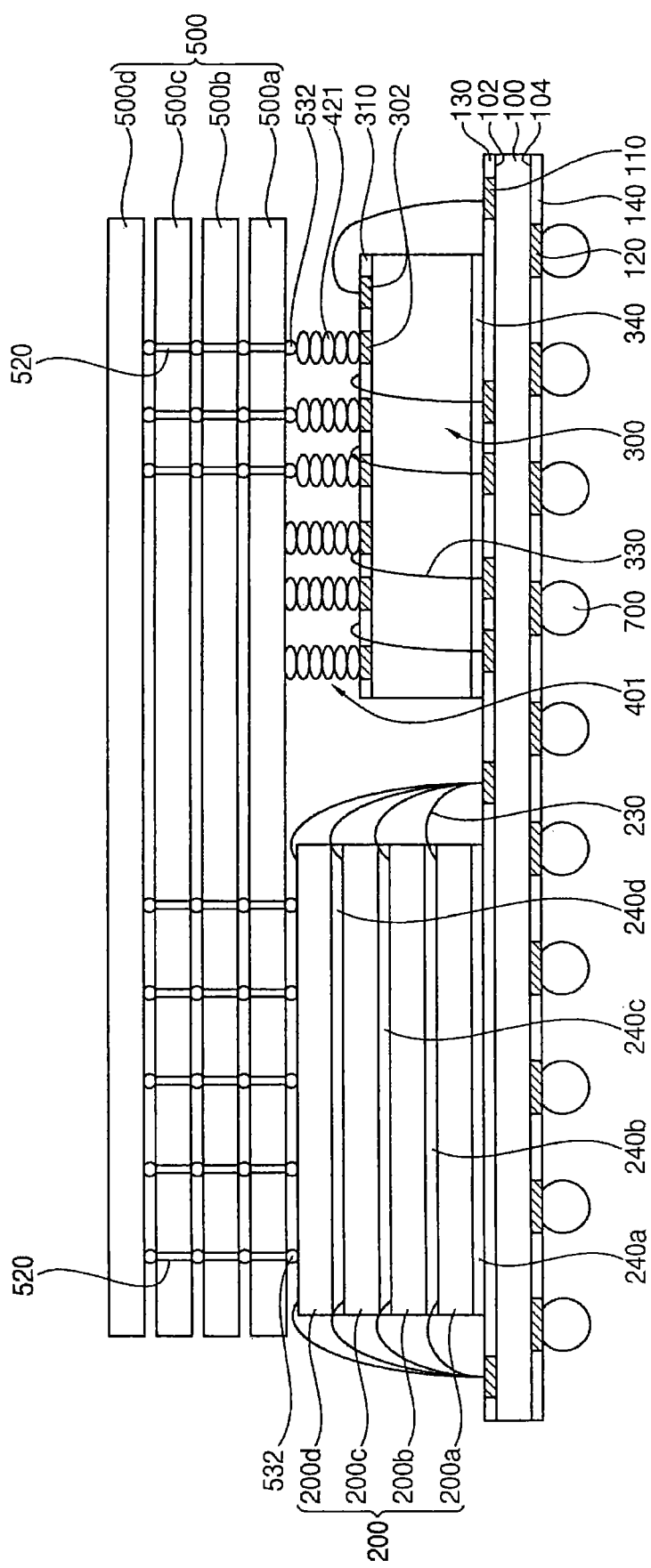

FIGS. 22 and 23 are views illustrating a method of manufacturing a semiconductor package in accordance with example embodiments of the inventive concept.

Referring to FIG. 22, the processes described with reference to FIG. 18 may be performed to arrange at least one support structure 401 on a second semiconductor chip 300.

Referring to FIG. 23, a plurality of the third semiconductor chips 500 may be stacked on the first semiconductor chip 200 and the support structure 401.

In example embodiments, a plurality of the third semiconductor chips 500 may be mounted on the first semiconductor chip 200 and the support structure 401 in a flip chip bonding manner. The third semiconductor chips 500 may be stacked on the first semiconductor chip 200 and the support structure 401 via solder bumps 532.

In some embodiments, bumps may be formed on the TSVs 520 of the lowermost third semiconductor chip 500a, and the third semiconductor chip 500 may be arranged on the first semiconductor chip 200 and the support structure 401, such that the bumps may be interposed between the uppermost first semiconductor chip 200d and the lowermost third semiconductor chip 500a and between the support structure 401 and the lowermost third semiconductor chip 500a.

Then, a solder reflow process may be performed to form the solder bump 532 between the chip pad of the lowermost third semiconductor chip 500a and a chip pad on an upper surface of the uppermost first semiconductor chip 200d, and to form the solder bumps 532 between the lowermost third semiconductor chip 500a and first dummy bumps 421 of a plurality of the dummy bumps 421. Accordingly, the lowermost third semiconductor chip 500a may be electrically connected to the semiconductor substrate 20 by the solder bumps 532.

Then, other third semiconductor chips 500b, 500c, 500d may be electrically connected to the semiconductor substrate 20 by the solder bumps 532. The TSVs 520 may be electrically connected to each other by the solder bumps 532. The third semiconductor chips 500b, 500c, 500d may be electrically connected to the semiconductor substrate 20 by the TSVs 520.

Then, a molding member may be formed on the semiconductor substrate 20 to cover the first semiconductor chips 200, the second semiconductor chip 300, the support structure 401 and the third semiconductor chips 500. Then, after outer connection members 700 are disposed on outer connection pads 120 on a lower surface 104 of the semiconductor substrate 20, the semiconductor substrate 20 may be cut by a sawing process into individual semiconductor packages.

Figure 24:
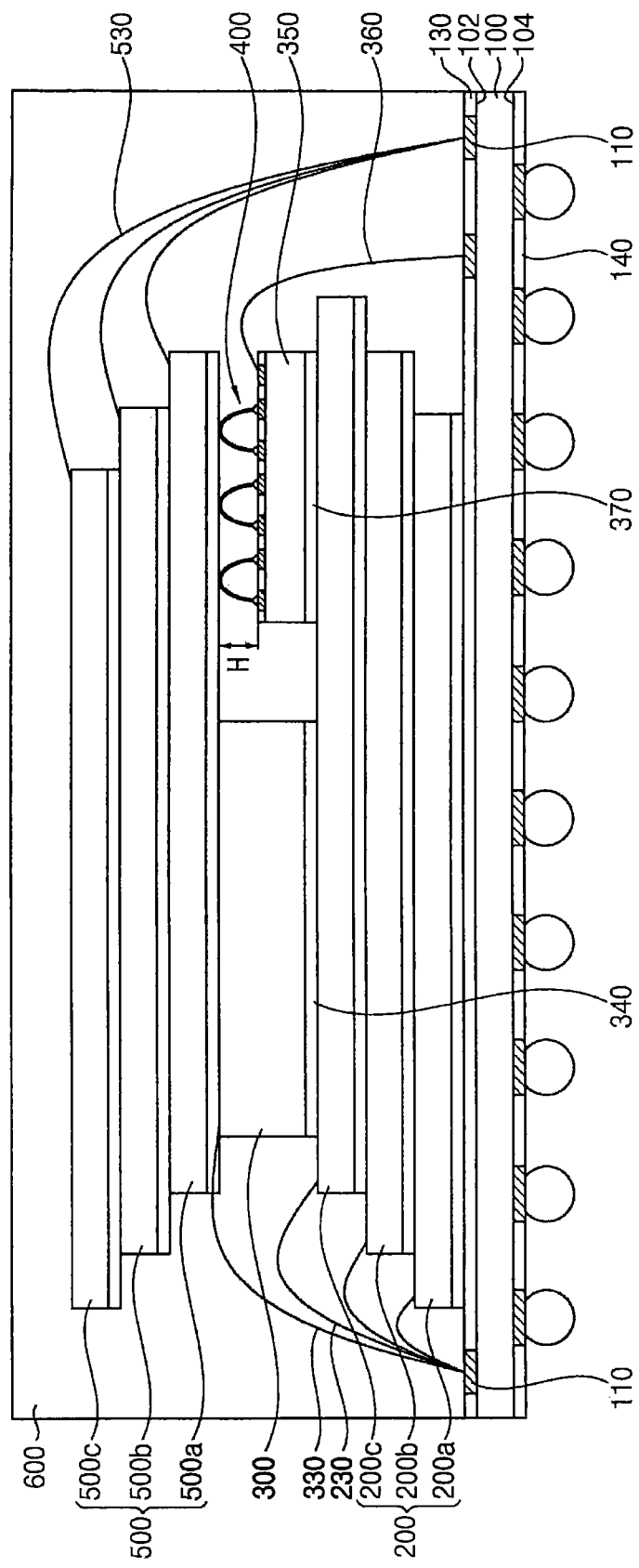

FIG. 24 is a cross-sectional view illustrating a semiconductor package in accordance with example embodiments of the inventive concept. The semiconductor package may be substantially the same as or similar to the semiconductor package embodiments described with reference to FIGS. 1 to 4 except for an arrangement of a support structure. Thus, the same reference numerals will be used to refer to the same or like elements and any further repetitive description concerning the above elements will be omitted.

Referring to FIG. 24, a semiconductor package 14 may include a package substrate 100, a plurality of first semiconductor chips 200, a second semiconductor chip 300, a third semiconductor chip 350, a support structure 400, a plurality of fourth semiconductor chips 500, and a molding member 600.

In example embodiments, a plurality of the first semiconductor chips 200 may be stacked on an upper surface 102 of the package substrate 100. First semiconductor chips 200a, 200b, 200c may be adhered on the package substrate 100 by adhesive members. The first semiconductor chip 200 may be electrically connected to the package substrate 100 by first conductive connection members 230. In particular, the first conductive connection members 230 may electrically connect a chip pad of the first semiconductor chip 200 to a substrate pad 110 of the package substrate 100.

In example embodiments, the second semiconductor chip 300 and the third semiconductor chip 350 may be stacked on the uppermost first semiconductor chip 200c of the first semiconductor chips 200 to be spaced apart from each other. The second semiconductor chip 300 may have a height greater than the third semiconductor chip 350. Accordingly, an upper surface of the second semiconductor chip 300 may be positioned higher than an upper surface of the third semiconductor chip 350 by a predetermined height H relative to an upper surface of the package substrate 100.

The support structure 400 may be disposed on the third semiconductor chip 350 having a relatively smaller height. The support structure 400 may be arranged between the third semiconductor chip 350 and the lowermost fourth semiconductor chip 500a of the fourth semiconductor chips 500 to support the fourth semiconductor chips 500. A first height of the second semiconductor chip 300 may be approximately equal to a sum of the height H of the support structure 400 and a second height of the third semiconductor chip 350.

A plurality of the fourth semiconductor chips 500 may be stacked on the second semiconductor chip 300 and the support structure 400. The fourth semiconductor chips 500 may be mounted on the uppermost first semiconductor chip 200c by way of the support structure 400. The fourth semiconductor chips 500a, 500b, 500c may be adhered on the support structure 400 using adhesive members.

The molding member 600 may be formed on the package substrate 100 to protect the first semiconductor chips 200, the second semiconductor chip 300, the third semiconductor chip 350, the support structure 400 and the fourth semiconductor chips 500 from the surrounding environment.

The semiconductor package may include semiconductor devices, such as logic devices and memory devices. For example, the semiconductor package may include logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
   a package substrate;
   at least one first semiconductor chip on the package substrate and having a first height as measured from the package substrate;
   a second semiconductor chip on the package substrate spaced apart from the first semiconductor chip and having a second height less than the first height as measured from the package substrate;
at least one third semiconductor chip stacked on the at least one first semiconductor chip and the second semiconductor chip; and
at least one support structure between the second semiconductor chip and the at least one third semiconductor chip configured to support the at least one third semiconductor chip,
wherein the at least one support structure comprises:
at least one dummy pad on the second semiconductor chip; and
at least one dummy wire having first and second end portions adhered to the at least one dummy pad and making contact with a lower surface of the at least one third semiconductor chip.

2. The semiconductor package of claim 1, wherein the second semiconductor chip comprises a redistribution wiring layer, which is an uppermost layer of the second semiconductor chip, and the redistribution wiring layer comprises the at least one dummy pad.

3. The semiconductor package of claim 2, wherein the redistribution wiring layer further comprises a plurality of bonding pads connected to a bonding wire.

4. The semiconductor package of claim 1, further comprising bonding wires electrically connecting the at least one first semiconductor chip and the second semiconductor chip to the package substrate.

5. The semiconductor package of claim 1, wherein the first height is approximately equal to a sum of a height of the at least one support structure and the second height.

6. The semiconductor package of claim 1, wherein a thickness of the at least one first semiconductor chip is less than a thickness of the second semiconductor chip.

7. The semiconductor package of claim 1, wherein the at least one first semiconductor chip comprises a memory chip and the second semiconductor chip comprises a logic chip.

8. A semiconductor package, comprising:
a package substrate;
a plurality of first semiconductor chips stacked sequentially on the package substrate and having a first height as measured from the package substrate;
a second semiconductor chip on the package substrate and having a second height less than the first height as measured from the package substrate;
a plurality of third semiconductor chips stacked on the package substrate so as to at least partially cover the first and second semiconductor chips in a plan view of the semiconductor package; and
at least one support structure between the second semiconductor chip and a lowermost third semiconductor chip of the plurality of third semiconductor chips configured to support the plurality of third semiconductor chips,
wherein the at least one support structure comprises:
at least two dummy pads on the second semiconductor chip; and
at least one dummy wire having first and second end portions adhered to the at least two dummy pads, respectively, and configured to support the lowermost third semiconductor chip.

9. The semiconductor package of claim 8, wherein the second semiconductor chip comprises a redistribution wiring layer, which is an uppermost layer of the second semiconductor chip, and the redistribution wiring layer comprises the at least two dummy pads.

10. The semiconductor package of claim 8, further comprising bonding wires electrically connecting the plurality of first semiconductor chips and the second semiconductor chip to the package substrate.

11. A method of manufacturing a semiconductor package, comprising:
sequentially stacking a plurality of first semiconductor chips on the package substrate so as to have a first height as measured from the package substrate;
forming a second semiconductor chip on the package substrate so as to have a second height less than the first height as measured from the package substrate;
forming a support structure on the second semiconductor chip; and
stacking a plurality of third semiconductor chips on the support structure so as to cover the plurality of first semiconductor chips and the second semiconductor chip in a plan view of the semiconductor package,
wherein forming the support structure on the second semiconductor chip comprises forming at least one dummy wire, first and second end portions of the dummy wire being adhered to at least two dummy pads on the second semiconductor chip, respectively.

12. The method of claim 11, wherein the second semiconductor chip comprises a redistribution wiring layer, which is an uppermost layer of the second semiconductor chip, and the redistribution wiring layer comprises the at least two dummy pads.

13. The method of claim 11, further comprising electrically connecting the plurality of first semiconductor chips and the second semiconductor chip to the package substrate using bonding wires.

* * * * *